(12) United States Patent
Yeh et al.

(10) Patent No.: US 12,327,815 B2
(45) Date of Patent: Jun. 10, 2025

(54) INTEGRATED CIRCUIT PACKAGE AND METHOD OF FORMING THE SAME

(71) Applicant: Taiwan Semiconductor Manufacturing Co., Ltd., Hsinchu (TW)

(72) Inventors: Der-Chyang Yeh, Hsinchu (TW); Sung-Feng Yeh, Taipei (TW); Jian-Wei Hong, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 439 days.

(21) Appl. No.: 17/817,738

(22) Filed: Aug. 5, 2022

(65) Prior Publication Data
US 2024/0047417 A1 Feb. 8, 2024

(51) Int. Cl.
*H01L 25/065* (2023.01)
*H01L 23/00* (2006.01)
*H01L 25/00* (2006.01)

(52) U.S. Cl.
CPC .......... *H01L 25/0652* (2013.01); *H01L 24/08* (2013.01); *H01L 24/80* (2013.01); *H01L 25/50* (2013.01); *H01L 2224/08145* (2013.01); *H01L 2224/80006* (2013.01); *H01L 2224/80895* (2013.01); *H01L 2224/80896* (2013.01); *H01L 2225/06541* (2013.01); *H01L 2225/06586* (2013.01)

(58) Field of Classification Search
CPC ................. H01L 25/0652; H01L 24/80; H01L 2224/08145; H01L 2225/06541; H01L 2224/80006; H01L 2225/06586
See application file for complete search history.

(56) References Cited

U.S. PATENT DOCUMENTS 8,916,481 B2 * 12/2014 Gan ...................... H01L 25/105
                                                                                    438/760
9,000,584 B2    4/2015 Lin et al.
(Continued)

FOREIGN PATENT DOCUMENTS

DE    102017117815 A1 *  3/2018 ......... H01L 21/4853
TW       201947725 A      12/2019
(Continued)

*Primary Examiner* — Mamadou L Diallo
(74) *Attorney, Agent, or Firm* — Slater Matsil, LLP

(57) ABSTRACT

A method includes attaching a first die and a second die to a first wafer, the first wafer comprising: a first carrier substrate; and a first interconnect structure comprising first dielectric layers and first conductive features embedded in the first dielectric layers; attaching a third die to the first die and a fourth die to the second die; attaching a second wafer to the third die and the fourth die, the second wafer comprising: a second carrier substrate; and a second interconnect structure comprising second dielectric layers and second conductive features embedded in the second dielectric layers; removing the first carrier substrate; patterning the first dielectric layers to expose conductive features of the first die and the second die; and forming external connectors through the first dielectric layers, the external connectors being electrically connected to corresponding ones of the conductive features of the first die and the second die.

20 Claims, 18 Drawing Sheets

(56) References Cited

U.S. PATENT DOCUMENTS

| | | | |
|---|---|---|---|
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2* | 6/2016 | Yu | H01L 23/5389 |
| 9,372,206 B2 | 6/2016 | Wu et al. | |
| 9,496,189 B2 | 11/2016 | Yu et al. | |
| 9,768,145 B2* | 9/2017 | Yu | H01L 23/49811 |
| 10,879,224 B2 | 12/2020 | Chen et al. | |
| 11,075,150 B2 | 7/2021 | Huang et al. | |
| 11,133,258 B2 | 9/2021 | Yu et al. | |
| 11,728,276 B2* | 8/2023 | Kaeding | H01L 23/3128 257/678 |
| 2009/0079096 A1* | 3/2009 | Tay | H01L 23/49541 257/E23.009 |
| 2012/0104562 A1* | 5/2012 | Pagaila | H01L 25/03 257/773 |
| 2017/0154868 A1* | 6/2017 | Jo | H01L 25/0652 |
| 2017/0194291 A1* | 7/2017 | Yu | H01L 23/481 |
| 2019/0131273 A1* | 5/2019 | Chen | H01L 24/19 |
| 2019/0287924 A1* | 9/2019 | Moon | H01L 24/82 |
| 2020/0006141 A1* | 1/2020 | Wang | H01L 21/563 |
| 2020/0161203 A1* | 5/2020 | Kim | H01L 23/49827 |
| 2021/0202389 A1* | 7/2021 | Hsieh | H01L 24/96 |
| 2021/0202438 A1* | 7/2021 | Liu | H01L 25/50 |
| 2021/0335753 A1* | 10/2021 | Hsu | H01L 24/82 |
| 2021/0343547 A1* | 11/2021 | Chang | H01L 25/0655 |
| 2021/0398947 A1* | 12/2021 | Shin | H01L 24/32 |
| 2022/0077063 A1* | 3/2022 | Haba | H01L 25/0652 |
| 2022/0310545 A1* | 9/2022 | Shih | H01L 24/19 |

FOREIGN PATENT DOCUMENTS

| | | |
|---|---|---|
| TW | 202017131 A | 5/2020 |
| TW | 202105626 A | 2/2021 |

* cited by examiner

INTEGRATED CIRCUIT PACKAGE AND METHOD OF FORMING THE SAME

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a tendency for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
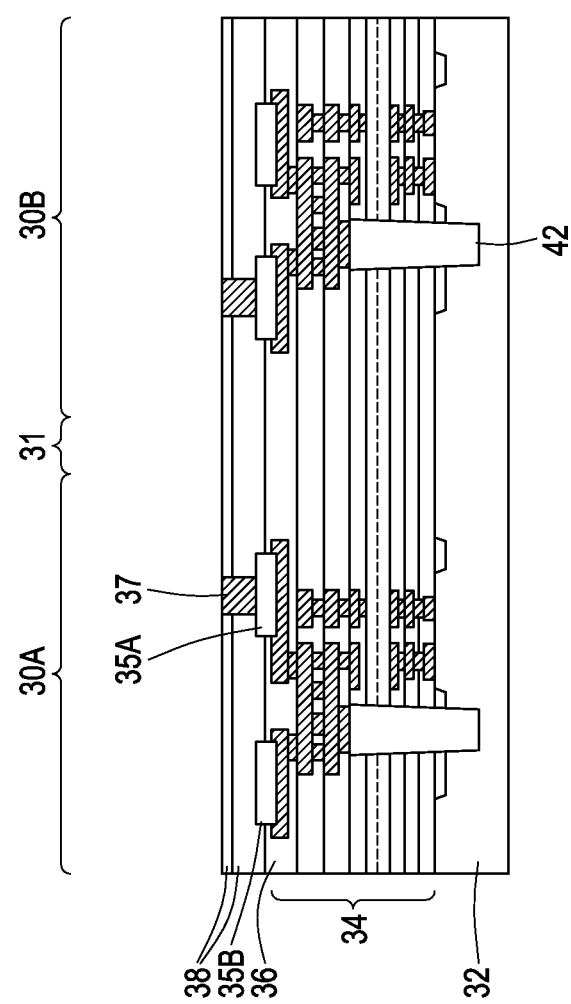
FIGS. 1-2 are cross-sectional views of integrated circuit dies formed in a wafer.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, an integrated circuit package is formed that includes integrated circuit devices (e.g., integrated circuit dies) laterally adjacent to one another and stacked on top of one another. For example, bottom dies may be attached and electrically connected to an interposer redistribution structure formed in a wafer. In addition, top dies may then be attached and electrically connected to the bottom dies. Further, a carrier redistribution structure (e.g., formed in a wafer) may be attached and electrically connected to the top dies. After attaching the carrier redistribution structure, external connectors may be formed through the interposer redistribution structure and electrically connected to the bottom dies in order to facilitate subsequent attachment of the integrated circuit package to a package substrate or one or more other devices. The integrated circuit package may undergo subsequent processing, such as being singulated and packaged with other components. The external connectors may be formed with direct electrical connection to the bottom dies and without direct electrical connection with to the interposer redistribution structure to improve or provide greater control of heat dissipation in or around conductive features of the interposer redistribution structure. In addition, attachment of the bottom dies and the top dies to one or both of the interposer redistribution structure and the carrier redistribution structure may be performed with high efficiency and increase the degree and variability of electrical connectivity between the integrated circuit dies, such as between laterally displaced bottom dies and laterally displaced top dies.

FIG. 1 is a cross-sectional view of integrated circuit dies 30 formed, for example, at a wafer level. Multiple integrated circuit dies 30 will be singulated from the wafer and packaged in subsequent processing to form integrated circuit packages, in accordance with some embodiments. Each integrated circuit die 30 may be a logic die (e.g., central processing unit (CPU), graphics processing unit (GPU), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, an interface die, a sensor die, a micro-electro-mechanical-system (MEMS) die, a signal processing die (e.g., digital signal processing (DSP) die), a front-end die (e.g., analog front-end (AFE) dies), the like, or combinations thereof (e.g., a system-on-a-chip (SoC) die). The integrated circuit die 30 may be formed in the wafer, which may include different die regions 30A, 30B separated from one another by scribe regions 31. In subsequent steps (see FIG. 3), the die regions 30A, 30B may be singulated through the scribe regions 31 to form a plurality of individual integrated circuit dies 30. The integrated circuit die 30 includes a semiconductor substrate 32, an interconnect structure 34, metal pads 35, and a dielectric layer 36, as well as die connectors 37 and dielectric layers 38 (see FIG. 2).

The semiconductor substrate 32 may be a substrate of silicon, doped or undoped, or an active layer of a semiconductor-on-insulator (SOI) substrate. The semiconductor substrate 32 may include other semiconductor materials, such as germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The semiconductor substrate 32 has an active surface (e.g., the surface facing upward in FIG. 1) and an inactive surface (e.g., the surface facing downward in FIG. 1). Devices (not specifically illustrated) are at the active surface of the semiconductor substrate 32. The devices may be active devices (e.g., transistors, diodes, etc.), capacitors, resistors, etc. The inactive surface may be free from devices.

The interconnect structure 34 is over the active surface of the semiconductor substrate 32, and is used to electrically connect the devices of the semiconductor substrate 32 to form an integrated circuit. The interconnect structure 34 may include one or more dielectric layer(s) and respective metallization layer(s) in the dielectric layer(s). Acceptable dielectric materials for the dielectric layers include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer such as polybenzoxazole (PBO), polyimide, a benzocyclobuten (BCB) based polymer, or the like. The metallization layer(s) may include conductive vias and/or conductive lines to interconnect the devices of the semiconductor substrate 32. The metallization layer(s) may be formed of a conductive material, such as a metal, such as copper, cobalt, aluminum, gold, combinations thereof, or the like. The interconnect structure 34 may be formed by a damascene process, such as a single damascene process, a dual damascene process, or the like.

Through vias 42 may be formed in the integrated circuit dies 30 so that external connections may be made to a back-side of the integrated circuit dies 30. The through vias 42 may also be referred to as through-substrate vias (TSVs), through-silicon vias, conductive vias, or the like. In the embodiments shown, the through vias 42 extend partially through the semiconductor substrate 32 of the respective integrated circuit die 30, to be subsequently exposed and physically and electrically connect the metallization layer(s) of the interconnect structure 34 to other package components. The through vias 42 are illustrated as extending continuously through most of the interconnect structure 34 for illustrative purposes. In some embodiments, the through vias 42 may extend through fewer or more of the dielectric layers of the interconnect structure 34. For example, the through vias 42 may extend through only the semiconductor substrate 32, only one of the dielectric layers of the interconnect structure 34, or through any number of the dielectric layers of the interconnect structure 34.

Still referring to FIG. 1, metal pads 35A and 35B (collectively referred to as metal pads 35) are disposed over and electrically connected to the metallization layers of the interconnect structure 34. The metal pads 35 may be within and/or over the dielectric layer 36 and comprise a metal, such as aluminum, copper, or the like. For example, the dielectric layer 36 may be one or more dielectric layers and comprise an oxide and/or a nitride, such as silicon oxynitride (SiON), silicon carbide (SiC), or any suitable material. The metal pads 35 may be considered part of the interconnect structure 34.

Die connectors 37 are disposed over the metal pads 35 and the dielectric layer 36 at a front side of the integrated circuit die 30. The die connectors 37 may be conductive pillars, pads, or the like, to which external connections are made.

The die connectors 37 may be formed of a metal, such as copper, aluminum, or the like, and can be formed by, for example, plating, or the like.

Optionally, solder regions (not specifically illustrated) may be disposed on the die connectors 37 in the formation of the integrated circuit die 30. The solder regions may be used to perform chip probe testing on the integrated circuit die 30. For example, the solder regions may be solder balls, solder bumps, or the like, which are used to attach a chip probe to the die connectors 37. Chip probe testing may be performed on the integrated circuit die 30 to ascertain whether the integrated circuit die 30 is a known good die (KGD). Thus, only integrated circuit dies 30, which are KGDs, undergo subsequent processing are packaged, and dies which fail the chip probe testing are not packaged. After testing, the solder regions may be removed in subsequent processing steps.

Dielectric layers 38 are disposed over the dielectric layer 36 at the front side of the integrated circuit die 30. The dielectric layers 38 laterally encapsulate the die connectors 37. As illustrated, the dielectric layers 38 may be one or more dielectric layers and may comprise an oxide, a nitride, a carbide, a polymer, the like, or combinations thereof. For example, an uppermost layer of the dielectric layers 36 may serve as a passivation layer of the integrated circuit die 30. The dielectric layers 38 may be formed, for example, by spin coating, lamination, chemical vapor deposition (CVD), or the like. Initially, the dielectric layers 38 may bury the die connectors 37, such that the top surface of the dielectric layers 38 is above the top surfaces of the die connectors 37. The die connectors 37 are exposed through the dielectric layers 38 during formation of the integrated circuit die 30. Exposing the die connectors 37 may remove any solder regions that may be present on the die connectors 37. A removal process can be applied to the various layers to remove excess materials over the die connectors 37. The removal process may be a planarization process such as a chemical mechanical polish (CMP), an etch-back, combinations thereof, or the like. After the planarization process, top surfaces of the die connectors 37 and the dielectric layers 38 are coplanar (within process variations) and are exposed at the front side of the integrated circuit die 30. Although not specifically illustrated, the die connectors 37 may protrude above the top surface of the dielectric layers 38.

As illustrated, in some embodiments, the die connectors 37 may be electrically connected to some of the metal pads 35A, and others of the metal pads 35B may remain covered by the dielectric layers 38. As discussed in greater detail below, the die connectors 37 (and corresponding metal pads 35A) may be utilized for electrical connection to other package components such as integrated circuit dies (e.g., through a redistribution structure), and the metal pads 35B may be utilized for electrical connection to external devices or other components of the integrated circuit package.

Figure 2:
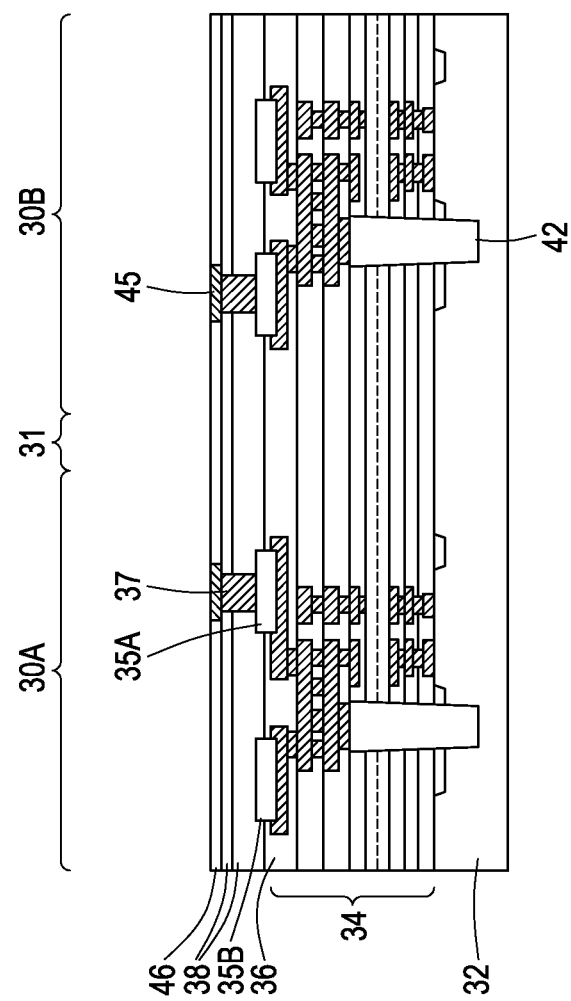

In FIG. 2, in some embodiments, bond pads 45 and a dielectric bond layer 46 are formed over the die connectors 37 and the dielectric layers 38. The dielectric bond layer 46 may be a single homogenous layer or a composite of two or more layers comprising, for example, an oxide and/or a nitride, such as silicon oxide (SiO), silicon oxynitride (SiON), silicon nitride (SiN), the like, or any suitable material(s). The dielectric bond layer 46 may be formed using ALD, CVD, Flowable Chemical Vapor Deposition (FCVD), spin coating, or the like. The dielectric bond layer 46 is then patterned to form openings, which are filled with a conductive material to form the bond pads 45, for example, similarly as described above in connection with the metal pads 35 or the die connectors 37.

In accordance with some embodiments, after forming the dielectric bond layer 46 and the bond pads 45, individual integrated circuit dies 30 are singulated from the wafer, using any suitable sawing process, in order for the KGDs to undergo subsequent processing and packaging as discussed below. In some embodiments, the integrated circuit dies 30 may be provided pre-singulated (see FIG. 3) and with the dielectric bond layer 46 and the bond pads 45 already formed.

FIGS. 3-11 are cross-sectional views of intermediate stages in the manufacturing of an integrated circuit package, in accordance with some embodiments. Specifically, the integrated circuit package is formed by bonding integrated circuit devices 50 (e.g., bottom dies 50A and top dies 50B, see FIG. 3) to a wafer (e.g., an interposer redistribution structure 100, see FIG. 4, and/or a carrier redistribution structure 200, see FIG. 9). The integrated circuit devices 50 may be the same or similar to singulated integrated circuit dies 30 described above (see FIGS. 1-2), wherein like reference numerals refer to like elements. Although illustrated as being different from one another, the bottom dies 50A and the top dies 50B may be the same, similar, or different from one another. In an embodiment, the integrated circuit package is a system on an integrated chip (SoIC) package, although it should be appreciated that embodiments may be applied to other three-dimensional integrated circuit (3DIC) packages such as chip-on-wafer (CoW) package. Although not specifically illustrated, the wafer may have a package region, which will be singulated in subsequent processing to form multiple integrated circuit packages. As a result, the integrated circuit package will include a singulated portion of the interposer redistribution structure 100 and/or the carrier redistribution structure 200 to which the bottom dies 50A and the top dies 50B will be bonded.

Figure 3:
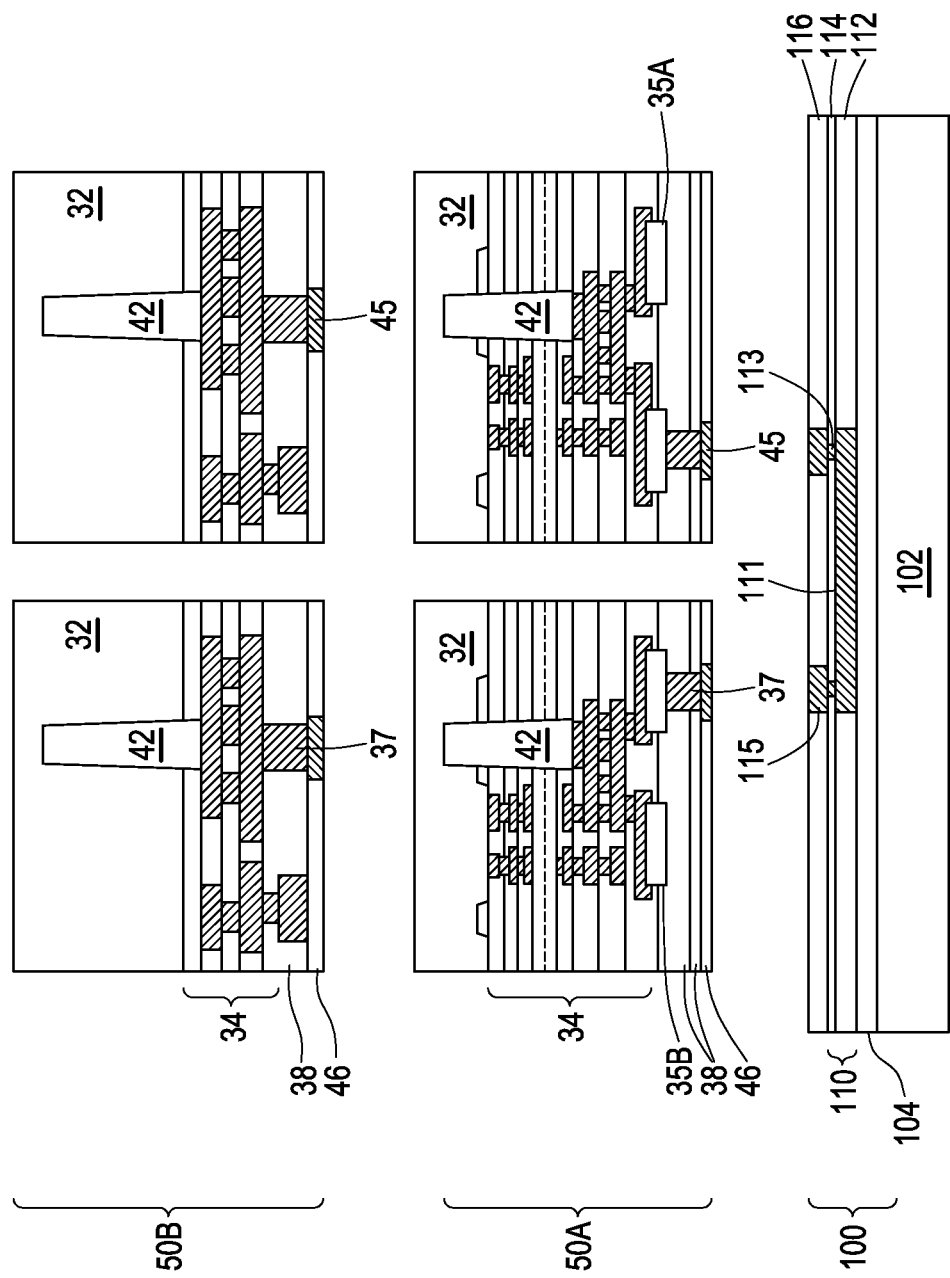
FIGS. 3-11 are cross-sectional views of intermediate stages in the manufacturing of an integrated circuit package, in accordance with some embodiments.

In FIG. 3, an interposer redistribution structure 100 is formed or provided, for example, at the wafer level, and bottom dies 50A and top dies 50B are provided for subsequent attachment to the interposer redistribution structure 100. The interposer redistribution structure 100 is formed over a carrier substrate 102 and includes an interconnect structure 110. In some embodiments, the interconnect structure 110 comprises dielectric layers 112, 114 (e.g., inter-metal dielectric layers (IMDs)) and conductive features 111, 113 (e.g., conductive lines and conductive vias) within the dielectric layers 112, 114 that provide various electrical interconnections. The conductive features 111, 113 may comprise electrical routing, conductive vias, conductive lines, or the like, and may be formed using a single damascene method, a dual damascene method, a combination thereof, or the like. In some embodiments (not specifically illustrated), the conductive features 111, 113 may be formed using a plating process, such as electroplating or electroless plating.

Optionally, an adhesive layer (not specifically illustrated) may be placed along the carrier substrate 102 in order to assist in the adherence of overlying features (e.g., the dielectric film 104 and the interconnect structure 110). In addition, the adhesive layer may be removable, for example, to facilitate subsequent removal of the carrier substrate 102 (see FIG. 10). In an embodiment, the adhesive layer may comprise an ultra-violet glue, which loses its adhesive properties when exposed to ultra-violet light. However, other types of adhesives, such as pressure sensitive adhesives, radiation curable adhesives, epoxies, combinations of these, or the like, may also be used. In some embodiments, the adhesive layer is an epoxy-based thermal-release material, which loses its adhesive property when heated, such as a light-to-heat-conversion (LTHC) release coating. The adhesive layer may be placed onto the carrier substrate 102 in a semi-liquid or gel form, which is readily deformable under pressure.

In some embodiments, a dielectric film 104 is disposed over the carrier substrate 102. The carrier substrate 102 comprises, for example, silicon based materials, such as glass or silicon oxide, or other materials, such as aluminum oxide, combinations of any of these materials, or the like. The carrier substrate 102 is planar in order to accommodate an attachment of semiconductor devices (e.g., bottom dies 50A and top dies 50B) similar to the integrated circuit dies 30 discussed above (see FIGS. 1-2). The dielectric film 104 may be an oxide such as silicon oxide, a nitride such as silicon nitride, or combinations thereof, and may be formed using CVD, ALD, the like, or a suitable method. In accordance with some embodiments, the dielectric film 104 is a silicon oxide layer. Optionally, an etch stop layer (not specifically illustrated) may be deposited over the dielectric film 104. The etch stop layer may comprise a material such as silicon nitride, silicon oxynitride, aluminum oxide, aluminum nitride, the like, or combinations thereof.

As discussed above, the interconnect structure may be formed using damascene processes. For example, a dielectric layer 112 may be formed over the dielectric film 104 (e.g., over the etch stop layer, if present). The dielectric layer 112 may be a material similar to that described for the dielectric film 104, such as an oxide (e.g., silicon oxide), and may be formed in a similar manner. In accordance with some embodiments, the dielectric layer 112 is formed of silicon oxide. Openings may be patterned in the dielectric layer 112, wherein the openings may expose the etch stop layer and/or the dielectric film 104.

Conductive features 111 are then formed in the openings of the dielectric layer 112. The conductive features 111 may include conductive rails providing inter-die communications, such as electrical communications between the bottom dies 50A. The conductive features 111 may have an entirety of a surface in physical contact with the dielectric film 104 (and/or the etch stop layer, if present). An optional conductive liner (not specifically illustrated) may first be formed in the openings, and a conductive material may be deposited over the conductive liner within the openings to form the conductive features 111. For example, the conductive liner may include titanium, titanium nitride, tantalum, tantalum nitride, or the like, and the conductive material may be copper, a copper alloy, silver, gold, tungsten, cobalt, aluminum, nickel, or the like. A planarization process may be performed to remove excess conductive material from a top surface of the dielectric layer 112. Although the conductive features 111 are illustrated with substantially vertical sidewalls, in some embodiments, the conductive features 111 may have sloped sidewalls, curved sidewalls, or another sidewall profile.

Although not specifically illustrated, additional dielectric layers and additional conductive features may be formed over the dielectric layer 112 and the conductive features 111 using a similar single damascene process or using a dual damascene process. Conductive features 113 may be formed in a dielectric layer 114 disposed over the conductive features 111 and the dielectric layer 112 using a similar manner as described above in connection with the conductive features 111 and the dielectric layer 112. As illustrated, in some embodiments, the conductive features 113 may be conductive vias.

In accordance with some embodiments, a dielectric bond layer 116 and conductive connectors 115 may be formed over the interconnect structure 110. The dielectric bond layer 116 may be formed in a similar manner as described above in connection with the dielectric layers 112, 114. In some embodiments, the dielectric bond layer 116 is a silicon nitride layer. The conductive connectors 115 may be bond pads, microbumps, ball grid array (BGA) connectors, solder balls, metal pillars, controlled collapse chip connection (C4) bumps, electroless nickel-electroless palladium-immersion gold technique (ENEPIG) formed bumps, or the like. The conductive connectors 115 may include a conductive material such as solder, copper, aluminum, gold, nickel, silver, palladium, tin, the like, or a combination thereof. In some embodiments, the conductive connectors 115 are formed by initially forming a layer of solder through evaporation, electroplating, printing, solder transfer, ball placement, or the like. Once a layer of solder has been formed on the structure, a reflow may be performed in order to shape the material into the desired bump shapes. In some embodiments, the conductive connectors 115 and the dielectric bond layer 116 are formed in a similar manner and using similar materials as described above in connection with the bond pads 45 and the dielectric bond layer 46, respectively.

In accordance with some embodiments, the conductive features 113, the dielectric layer 114, the conductive connectors 115, and the dielectric bond layer 116 are formed using a dual damascene process. For example, the dielectric layer 114 (e.g., comprising silicon oxide) may be deposited over the dielectric layer 112, and the dielectric bond layer 116 (e.g., comprising silicon nitride) may be deposited over the dielectric layer 114. Openings may be formed through the dielectric layer 114 and the dielectric bond layer 116 to expose portions of the conductive features 111. A conductive liner and a conductive material may be deposited in the openings and over the dielectric bond layer 116, and a planarization process may be performed to remove excess portions of the conductive material and the conductive liner from a top surface of the dielectric bond layer 116.

In some embodiments (not separately illustrated), the interconnect structure 110 of the interposer redistribution structure 100 is formed using a plating process. For example, the dielectric film 104, the dielectric layer 112, and the dielectric layer 114 may be polymer layers. In particular, the dielectric film 104 may be polybenzoxazole (PBO), although any suitable material, such as polyimide or a polyimide derivative, Solder Resistance (SR), or Ajinomoto build-up film (ABF) may be utilized. The dielectric film 104 may be placed using, e.g., a spin-coating process to a suitable thickness, although any suitable method and thickness may be used. The dielectric layers 112, 114 may be formed of similar materials as described above in connection with the dielectric film 104, such as PBO, a polyimide, a polyimide derivative, the like, or any suitable material, and deposited using, for example, a spin-coating process. In some embodiments, the conductive features 111 are formed by depositing a seed layer (e.g., comprising a titanium copper alloy, aluminum copper alloy, gold, or the like) by CVD, PVD, sputtering, or any suitable method. A sacrificial material (e.g., a photoresist) may then be formed over the seed layer and patterned to form openings in the sacrificial material that expose portions of the seed layer. A conductive filler material in the dielectric layers 112, 114. For example, a plating process, such as electroplating or electroless plating, or any suitable process may be used to form the conductive features 111, and the sacrificial material may be removed thereafter using, for example, an ashing process.

The conductive features 113 may be formed in a similar manner as the conductive features 111. The conductive connectors 115 and the dielectric bond layer 116 may be formed in a similar manner as the conductive features 111, 113 and the dielectric layers 112, 114 described in these embodiments or described in the illustrated embodiments discussed above.

FIG. 3 further illustrates cross-sectional views of singulated integrated circuit devices 50 (e.g., bottom dies 50A and top dies 50B) to be subsequently attached to the interposer redistribution structure 100 (see FIG. 4), in accordance with some embodiments. Although two bottom dies 50A and two top dies 50B are shown, any suitable number of dies 50 may be provided for attachment to the interposer redistribution structure 100. In addition, each integrated circuit device 50 may be a version of the singulated integrated circuit die 30 (see FIGS. 1-2). Each of the dies 50 may have a single function (e.g., a logic device, memory die, etc.) or may have multiple functions. In some embodiments, some of the dies 50 are logic devices, such as system-on-integrated-chip (SoIC) devices, and some of the dies 50 are memory devices such as high bandwidth memory (HBM) devices or high bandwidth memory cube (HMC) devices.

Figure 4:
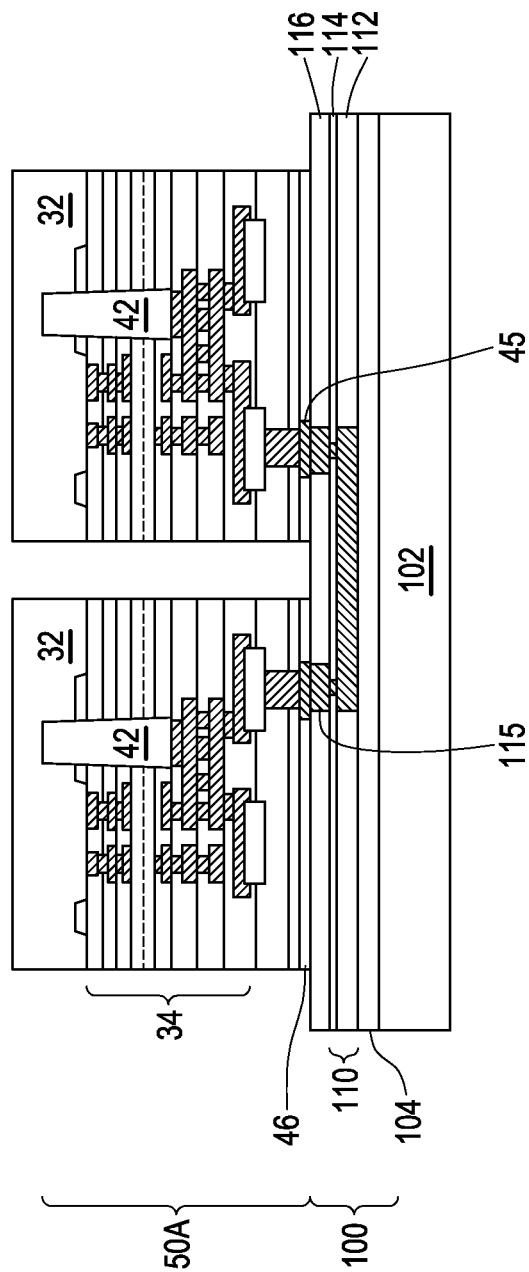

In FIG. 4, the bottom dies 50A may be attached to a package region of the interposer redistribution structure 100 with a front side (e.g., an active side) of the bottom dies 50A facing the interposer redistribution structure 100. It should be noted that the bottom dies 50A may be attached to other package regions of the interposer redistribution structure 100 (e.g., at the wafer level) that may not be specifically illustrated. As discussed above, the conductive connectors 115 of the interposer redistribution structure 100 may be bond pads or another feature that would also be suitable for direct bonding with the bond pads 45 of the bottom dies 50A. For example, hybrid bonding, fusion bonding, dielectric bonding, metal bonding, or the like may be used to directly bond the dielectric bond layer 46 and bond pads 45 of the bottom dies 50A to the dielectric bond layer 116 and the conductive connectors 115, respectively, without the use of adhesive or solder. Similarly as the integrated circuit dies 30 (see FIGS. 1-2), the bottom dies 50A include through vias 42 that extend at least partially into the interconnect structure 34 and the semiconductor substrate 32. The through vias 42 are electrically connected to metallization layer(s) of the interconnect structures 34. As further illustrated, the through vias 42 may be covered by a portion of the semiconductor substrate 32 along a back side (e.g., an inactive side) of the bottom dies 50A.

A desired type and quantity of the bottom dies 50A are attached to the interposer redistribution structure 100 in each package region. Although two bottom dies 50A are illustrated as being placed adjacent one another, any number greater than two may be attached in each package region in a suitable arrangement. As noted above, the various bottom dies 50A may have different functions from one another. For example, some of the bottom dies 50A may be logic devices, and others of the bottom dies 50A may be memory devices. In addition, the various bottom dies 50A may have been formed in processes of a same technology node, or may have been formed in processes of different technology nodes.

In accordance with some embodiments, the bonding of the bottom dies 50A to the interposer redistribution structure 100 may be achieved through hybrid bonding, in which both of metal-to-metal direct bonding (between the bond pads 45 of the bottom dies 50A and the conductive connectors 115 of the interposer redistribution structure 100) and dielectric-to-dielectric bonding (such as Si—O—Si and/or Si—N—Si bonding between the dielectric bond layer 46 and the dielectric bond layer 116) are formed.

In some embodiments, the dielectric bond layer 46 of the bottom dies 50A is bonded to the dielectric bond layer 116 of the interconnect redistribution structure 100 through dielectric-to-dielectric bonding without using any adhesive material (e.g., die attach film). Similarly, the bond pads 45 are bonded to the conductive connectors 115 through metal-to-metal bonding, without using any eutectic material (e.g., solder). The bonding may include a pre-bonding and an annealing. During the pre-bonding, a small pressing force may be applied to press the bottom dies 50A against the interposer redistribution structure 100. The pre-bonding is performed at a low temperature, such as room temperature (e.g., ranging from 15° C. to 30° C.), and after the pre-bonding, the dielectric bond layer 46 and the dielectric bond layer 116 are bonded to each other. The bonding strength is then improved in a subsequent annealing step, in which the structure is annealed at a high temperature, such as a temperature ranging from 100° C. to 450° C. After the annealing, bonds (e.g., fusion bonds and/or chemical bonds) are formed between the dielectric bond layer 46 and the dielectric bond layer 116. For example, the bonds can be covalent bonds between the material of the dielectric bond layer 46 and the material of the dielectric bond layer 116.

As illustrated, the bond pads 45 of the bottom dies 50A and the conductive connectors 115 of the interposer redistribution structure 100 are aligned and electrically connected to each other. The bond pads 45 and the conductive connectors 115 may be in physical contact during the pre-bonding, or may expand to be brought into physical contact during the annealing. Further, during the annealing, the material of the bond pads (e.g., copper) and the material of the conductive connectors 115 (e.g., copper) intermingle, so that metal-to-metal bonds are also formed. Hence, the resulting bonds between the bottom dies 50A and the interposer redistribution structure 100 are hybrid bonds that include both dielectric-to-dielectric bonds and metal-to-metal bonds.

Although illustrated with hybrid bonding, the bottom dies 50A may be attached to the interposer redistribution structure 100 using other bonding techniques, such as attaching the bottom dies 50A using solder balls and forming an underfill around the solder balls and between the bottom dies 50A and the interposer redistribution structure 100. For example, electrical connectors (not illustrated), such as microbumps, ball grid array (BGA) connectors, solder balls, metal pillars, controlled collapse chip connection (C4) bumps, electroless nickel-electroless palladium-immersion gold technique (ENEPIG) formed bumps, or the like may be used to electrically couple the conductive connectors 115 of the interposer redistribution structure 100 to the bond pads 45 of the bottom dies 50A. In some embodiments, the bottom dies 50A may be placed on the interposer redistribution structure 100 using, e.g., a pick-and-place tool. The electrical connectors, formed of a conductive material that is reflowable, such as solder, copper, aluminum, gold, nickel, silver, palladium, tin, the like, or a combination thereof, may be formed by initially forming a layer of solder through methods such as evaporation, electroplating, printing, solder transfer, ball placement, or the like. Once a layer of solder has been formed on the structure, a reflow may be performed in order to shape the electrical connectors into desired bump shapes. Attaching the bottom dies 50A to the interposer redistribution structure 100 may include placing the bottom dies 50A on the interposer redistribution structure 100 and reflowing the electrical connectors.

In addition, regarding these embodiments (not specifically illustrated) an underfill may be formed around the conductive connectors 115 and the bond pads 45 and between the interposer redistribution structure 100 and the bottom dies 50A. The underfill may reduce stress and protect the joints resulting from the reflowing of the conductive connectors 115. The underfill may be formed of an underfill material such as a molding compound, epoxy, or the like. The underfill may be formed by a capillary flow process after the bottom dies 50A are attached to the interposer redistribution structure 100, or may be formed by a suitable deposition method before the bottom dies 50A are attached to the interposer redistribution structure 100. The underfill may be applied in liquid or semi-liquid form and then subsequently cured.

Further, in some embodiments (not specifically illustrated), a mix of bonding techniques could be used, wherein some of the bottom dies 50A may be attached to the interposer redistribution structure 100 by solder bonds, and others of the bottom dies 50A may be attached to the interposer redistribution structure 100 by direct bonds.

Figure 5:
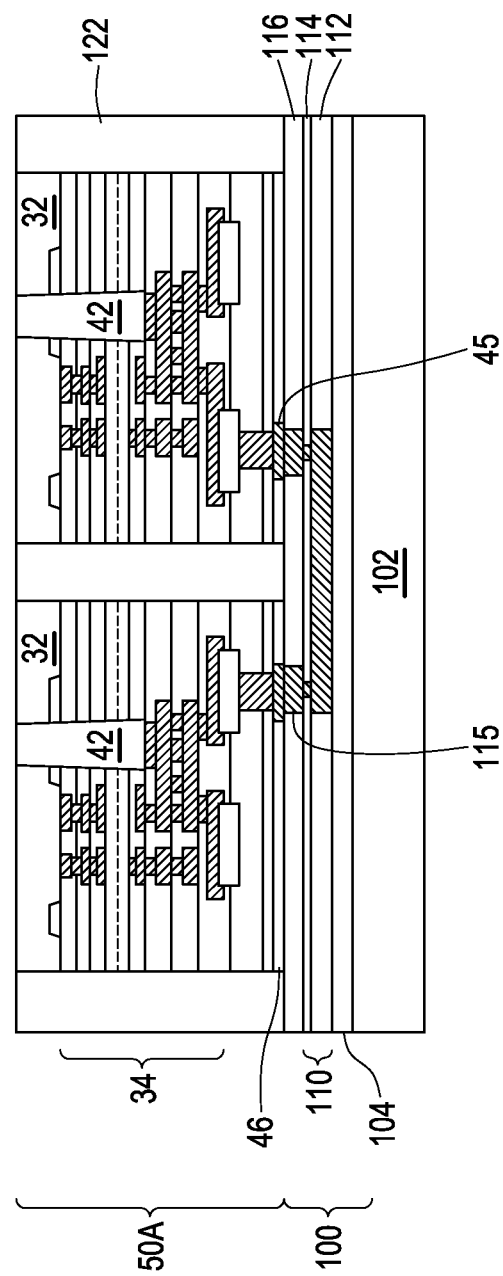

In FIG. 5, an encapsulant 122 is formed on and around the various components, and a thinning process is performed on the semiconductor substrate 32 of the bottom dies 50A. After formation, the encapsulant 122 encapsulates upper surfaces and sidewalls of the bottom dies 50A. The encapsulant 122 is further formed in gap regions between the bottom dies 50A. The encapsulant 122 may be a molding compound, an epoxy, a resin, or the like. The encapsulant 122 may be applied by compression molding, transfer molding, or the like, and may be formed over the structure such that the bottom dies 50A are buried or covered. As additional examples, the encapsulant 122 may comprise a nitride (e.g., silicon nitride) and/or an oxide (e.g., silicon oxide) and may be deposited using spin coating, FCVD, PECVD, LPCVD, ALD, or any suitable process. The encapsulant 122 may be applied in liquid or semi-liquid form and then subsequently cured. The encapsulant 122 is optionally thinned to expose the bottom dies 50A. The thinning process may be a grinding process, a chemical-mechanical polish (CMP), an etch-back, combinations thereof, or the like and may remove portions of the bottom dies 50A. After the thinning process, the top surfaces of the encapsulant 122 and the bottom dies 50A are coplanar (within process variations). The thinning is performed until a desired amount of the encapsulant 122 and the bottom dies 50A has been removed. In accordance with some embodiments, the thinning may be stopped without exposing the through vias 42 of the bottom dies 50A.

In some embodiments (not specifically illustrated), a liner layer may be formed over and between the bottom dies 50A before forming the encapsulant 122. The liner layer may be a conformal layer extending along the upper surfaces and the sidewalls of the bottom dies 50A as well as along upper surfaces of the dielectric bond layer 116 and may serve as a moisture stop layer. The liner layer is formed of a dielectric material that has good adhesion to the sidewalls of the bottom dies 50A. For example, the liner layer may be formed of an extra low-k (ELK) material, including a nitride (e.g., silicon nitride) and/or an oxide (e.g., silicon oxide). Deposition of the liner layer may include a conformal deposition process such as ALD, CVD, or any suitable process. The encapsulant 122 may then be formed over the liner layer as described above. The thinning process may then remove portions of the liner layer and the encapsulant 122 from the top surfaces (e.g., the back sides) of the bottom dies 50A.

Figure 6:
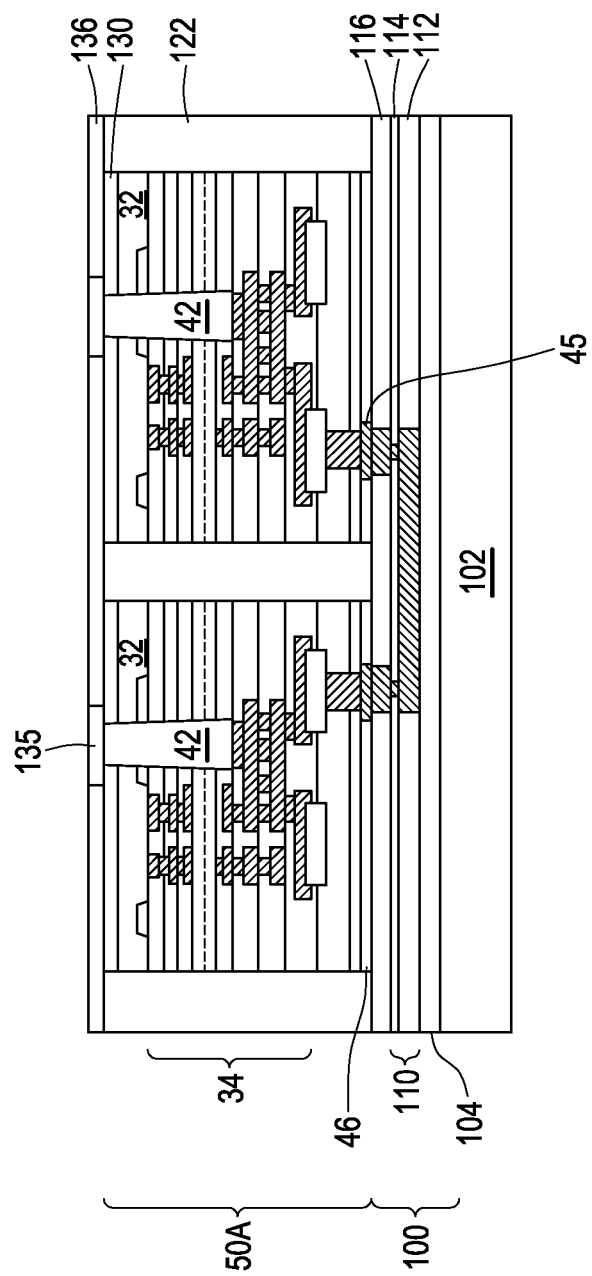

In FIG. 6, one or more removal process(es) may be performed on the encapsulant 122 and the semiconductor substrate 32 of the bottom dies 50A to expose the through vias 42, if they are not already exposed. The removal process may include a planarization process such as a chemical mechanical polish (CMP), a grinding process, an etch-back, combinations thereof, or the like. In some embodiments, the removal process is performed to thin the semiconductor substrate 32 of the bottom dies 50A and expose the through vias 42. After exposing the through vias 42, top surfaces of the encapsulant 122, the semiconductor substrate 32, and the through vias 42 are coplanar (within process variations).

Optionally, the removal process further includes etching the semiconductor substrate 32 and forming dielectric layers 130 over the etched semiconductor substrate 32. The dielectric layers 130 may serve as barrier layers and help electrically isolate adjacent through vias 42 from one another, thus avoiding shorting. As an example to form the dielectric layers 130, the semiconductor substrate 32 of the bottom dies 50A may be recessed to expose sidewall portions of the through vias 42. The recessing may be by an etching process, such as a dry etch. The dielectric layers 130 can then be formed in the recesses. The dielectric layers 130 may be one or more layers and include a dielectric material such as a low temperature polyimide material and an oxide such as silicon oxide, although any other suitable dielectric materials, such as PBO, an encapsulant, combinations thereof, or the like may also be utilized. A planarization process, such as a CMP, grinding, or etch-back, can be performed to remove excess portions of the dielectric layers 130 over the semiconductor substrate 32 of the bottom dies 50A. The remaining portions of the dielectric layers 130 are laterally surrounded by the encapsulant 122. The top surfaces of the encapsulant 122, the dielectric layers 130, and the through vias 42 are coplanar (within process variations).

As illustrated, in some embodiments, bond pads 135 and a dielectric bond layer 136 are formed over the bottom dies 50A, the encapsulant 122, and the dielectric layers 130 (if present). The dielectric bond layer 136 may be a single homogenous layer or a composite of two or more layers comprising, for example, an oxide and/or a nitride, such as silicon oxide (SiO), silicon oxynitride (SiON), silicon nitride (SiN), the like, or any suitable material(s). The dielectric bond layer 136 may be formed using ALD, CVD, Flowable Chemical Vapor Deposition (FCVD), spin coating, or the like. The dielectric bond layer 136 is then patterned to form openings, which are filled with a conductive material to form the bond pads 135, for example, similarly as described above in connection with the die connectors 37, the bond pads 45, and/or the conductive connectors 115.

Figure 7:
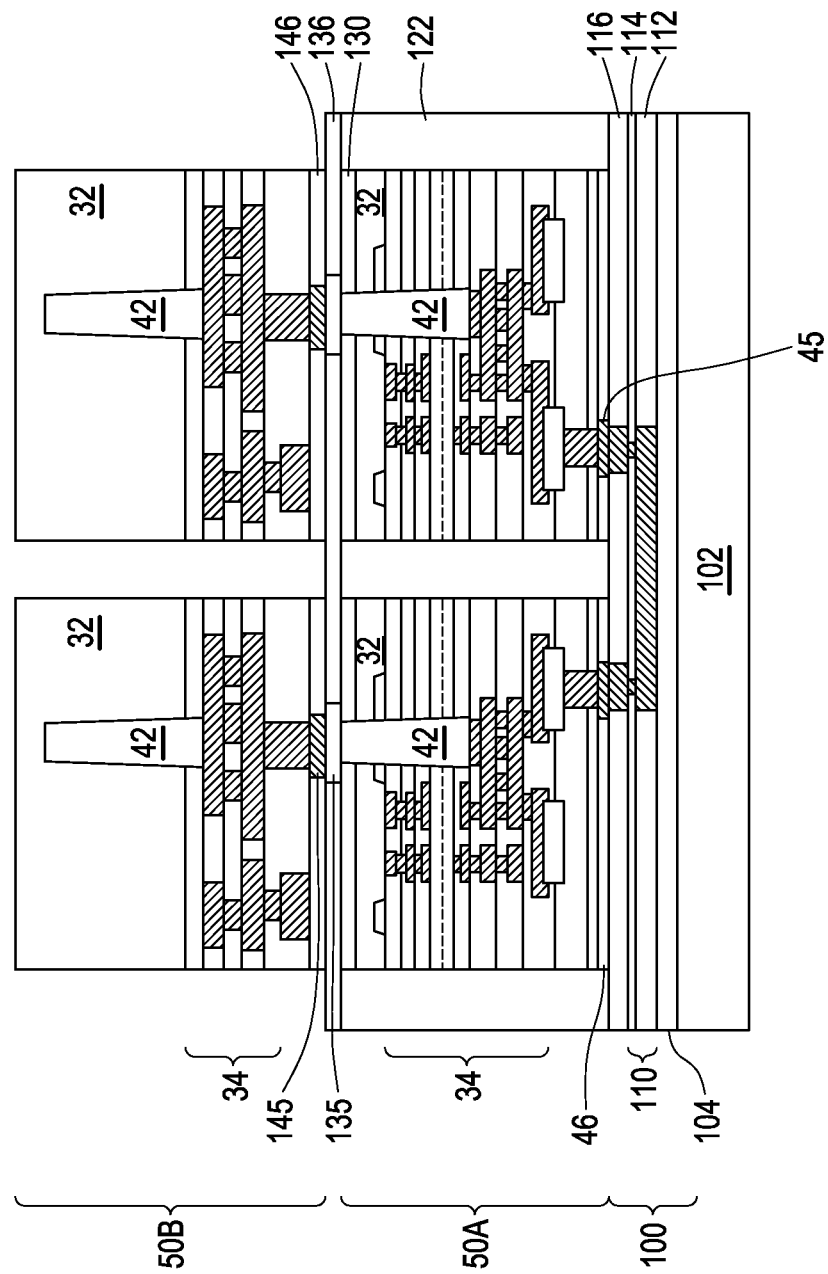

In FIG. 7, top dies 50B may be attached to the bottom dies 50A with a front side (e.g., an active side) facing the back side of the bottom dies 50A. It should be noted that the top dies 50B may be attached to other package regions of the structure (e.g., at the wafer level) that may not be specifically illustrated. As discussed above, the top dies may be similar to or the same as described above in connection with singulated integrated circuit dies 30 (see FIGS. 1-2) and the bottom dies 50A (see FIG. 3). In addition, although illustrated different from the bottom dies 50A, the top dies 50B may be the same as or different from the bottom dies 50A. In some embodiments, a dielectric bond layer 146 and bond pads 145 are first formed on the front side of the top dies 50B and direct bonded to the dielectric bond layer 136 and the bond pads 135, respectively. The top dies 50B may be direct bonded to the bottom dies 50A similarly as described above in connection with attaching the bottom dies 50A to the interposer redistribution structure 100. For example, hybrid bonding, fusion bonding, dielectric bonding, metal bonding, or the like may be used to directly bond the dielectric bond layer 136 and the bond pads 135 of the bottom dies 50A to the dielectric bond layer 146 and the bond pads 145 of the top dies 50B without the use of adhesive or solder. Similarly as the integrated circuit dies 30 and the bottom dies 50A, the top dies 50B may also include through vias 42 that extend at least partially into the interconnect structure 34 and/or the semiconductor substrate 32. The through vias 42 are electrically connected to metallization layer(s) of the interconnect structures 34. As further illustrated, the through vias 42 may be covered by a portion of the semiconductor substrate 32. In some embodiments (see, e.g., FIGS. 15 and 17), some or all of the top dies 50B do not include the through vias 42 extending through corresponding semiconductor substrates 32 along a back side (e.g., an inactive side) of the top dies 50B.

A desired type and quantity of the top dies 50B are attached to the bottom dies 50A in each package region. Although two top dies 50B are illustrated as being placed adjacent one another and over corresponding bottom dies 50A, any number greater than two may be attached in each package region in a suitable arrangement. In addition, in some embodiments, one of the top dies 50B may be attached over more than one corresponding bottom dies 50A. As noted above, the various top dies 50B may have different functions from one another. For example, some of the top dies 50B may be logic devices, and others of the top dies 50B may be memory devices. Similarly, some of the top dies 50B and corresponding bottom dies 50A may form individual die stacks. As such, some of the die stacks may have different functions from others, such as forming logic devices while others form memory devices. For example, some of the die stacks may include top dies 50B and bottom dies 50A such that one is a memory device and the other is a logic device. In addition, some of the die stacks may include top dies 50B and bottom dies 50A such that one is an integrated circuit die (e.g., logic device or memory device) and the other is a redistribution structure. It should be appreciated that any suitable combination of the bottom dies 50A and the top dies 50B may be utilized. Further, the top dies 50B and the bottom dies 50A may have a same or different size and shape, and the various top dies 50B may have been formed in processes of a same technology node, or may have been formed in processes of different technology nodes.

Although illustrated with hybrid bonding, similarly as described above in connection with attaching the bottom dies 50A to the interposer redistribution structure 100, the top dies 50B may be attached to the bottom dies 50A using other bonding techniques, such as attaching the top dies 50B using solder balls and forming an underfill around the solder balls and between the top dies 50B and the bottom dies 50A. For example, electrical connectors (not illustrated), such as microbumps, ball grid array (BGA) connectors, solder balls, metal pillars, controlled collapse chip connection (C4) bumps, electroless nickel-electroless palladium-immersion gold technique (ENEPIG) formed bumps, or the like may be used to electrically couple the bond pads 135 adjacent the bottom dies 50A to the bond pads 145 of the top dies 50B. In some embodiments, the top dies 50B may be placed on the bottom dies 50A using, e.g., a pick-and-place tool. The electrical connectors may be formed of a conductive material that is flowable, such as solder, copper, aluminum, gold, nickel, silver, palladium, tin, the like, or a combination thereof, may be formed by initially forming a layer of solder through methods such as evaporation, electroplating, printing, solder transfer, ball placement, or the like. In some embodiments, layer of solder may be deposited over the bond pads 135 or the bond pads 145, the solder may be reflowed to shape the electrical connectors into a desired shape, the top dies 50B may be placed onto the bottom dies 50A, and the electrical connectors may be reflowed to attach the top dies 50B to the bottom dies 50A.

In addition, regarding these embodiments (not specifically illustrated), an underfill may be formed around the bond pads 135, 145 and between the top dies 50B and the bottom dies 50A. The underfill may reduce stress and protect the joints resulting from the reflowing of the conductive material. The underfill may be formed of an underfill material such as a molding compound, epoxy, or the like. The underfill may be formed by a capillary flow process after the top dies 50B are attached to the bottom dies 50A or may be formed by a suitable deposition method before the top dies 50B are attached to the bottom dies 50A. The underfill may be applied in liquid or semi-liquid form and then subsequently cured.

Figure 8:
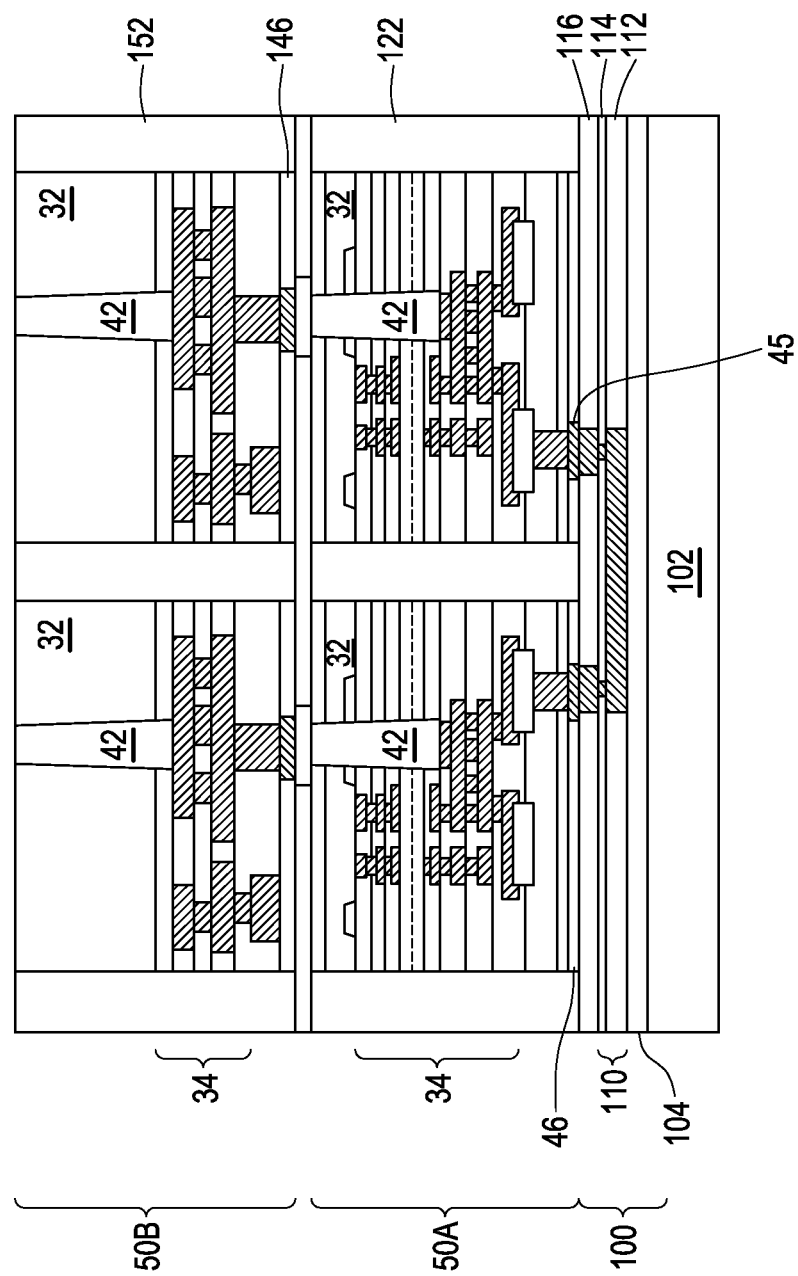

In FIG. 8, an encapsulant 152 is formed on and around the various components, and a thinning process is performed on the semiconductor substrates 32 of the top dies 50B. After formation, the encapsulant 152 encapsulates upper surfaces and sidewalls of the top dies 50B. The encapsulant 152 is further formed in gap regions between the top dies 50B. For example, the encapsulant 152 may be a molding compound, an epoxy, a resin, or the like. The encapsulant 152 may be applied by compression molding, transfer molding, or the like, and may be formed over the structure such that the top dies 50B are buried or covered. As additional examples, the encapsulant 152 may comprise a nitride (e.g., silicon nitride) and/or an oxide (e.g., silicon oxide) and may be deposited using spin coating, FCVD, PECVD, LPCVD, ALD, or any suitable process. The encapsulant 152 may be applied in liquid or semi-liquid form and then subsequently cured. The encapsulant 152 is optionally thinned to expose the top dies 50B. The thinning process may be a grinding process, a chemical-mechanical polish (CMP), an etch-back, combinations thereof, or the like. After the thinning process, the top surfaces of the encapsulant 152 and the top dies 50B are coplanar (within process variations). The thinning is performed until a desired amount of the encapsulant 152 and the top dies 50B has been removed.

In some embodiments (not specifically illustrated), a liner layer may be formed over and between the bottom dies 50A before forming the encapsulant 152. The liner layer may be a conformal layer extending along the upper surfaces and the sidewalls of the top dies 50B as well as along upper surfaces of the dielectric bond layer 136 and may serve as a moisture stop layer. The liner layer is formed of a dielectric material that has good adhesion to the sidewalls of the top dies 50B. For example, the liner layer may be formed of an extra low-k (ELK) material, including a nitride (e.g., silicon nitride) and/or an oxide (e.g., silicon oxide). Deposition of the liner layer may include a conformal deposition process such as ALD, CVD, or any suitable process. The encapsulant 152 may then be formed over the liner layer as described above. The thinning process may then remove portions of the liner layer and the encapsulant 152 from the top surfaces (e.g., the back sides) of the top dies 50B.

As further illustrated, one or more removal process(es) may be performed on the encapsulant 152 and the semiconductor substrate 32 of the top dies 50B to expose the through vias 42, if they are not already exposed. The removal process may include a planarization process such as a chemical mechanical polish (CMP), a grinding process, an etch-back, combinations thereof, or the like. In some embodiments, the removal process is performed to thin the semiconductor substrate 32 of the top dies 50B and expose the through vias 42. After exposing the through vias 42, top surfaces of the encapsulant 152, the semiconductor substrate 32, and the through vias 42 are coplanar (within process variations).

In some embodiments (not specifically illustrated), the removal process further includes etching the semiconductor substrate 32 to result in the through vias 42 protruding above a top surface of the semiconductor substrate 32, for example, similarly as described above in connection with the semiconductors substrate 32 of the bottom dies 50A (see FIG. 6). A dielectric layer may then be formed over the semiconductor substrate 32, and a planarization process may be performed to level the dielectric layer with the through vias 42. The dielectric layer may serve as an isolation layer for the through vias 42 and/or as a passivation layer for the semiconductor substrate 32 and the through vias 42.

Figure 9:
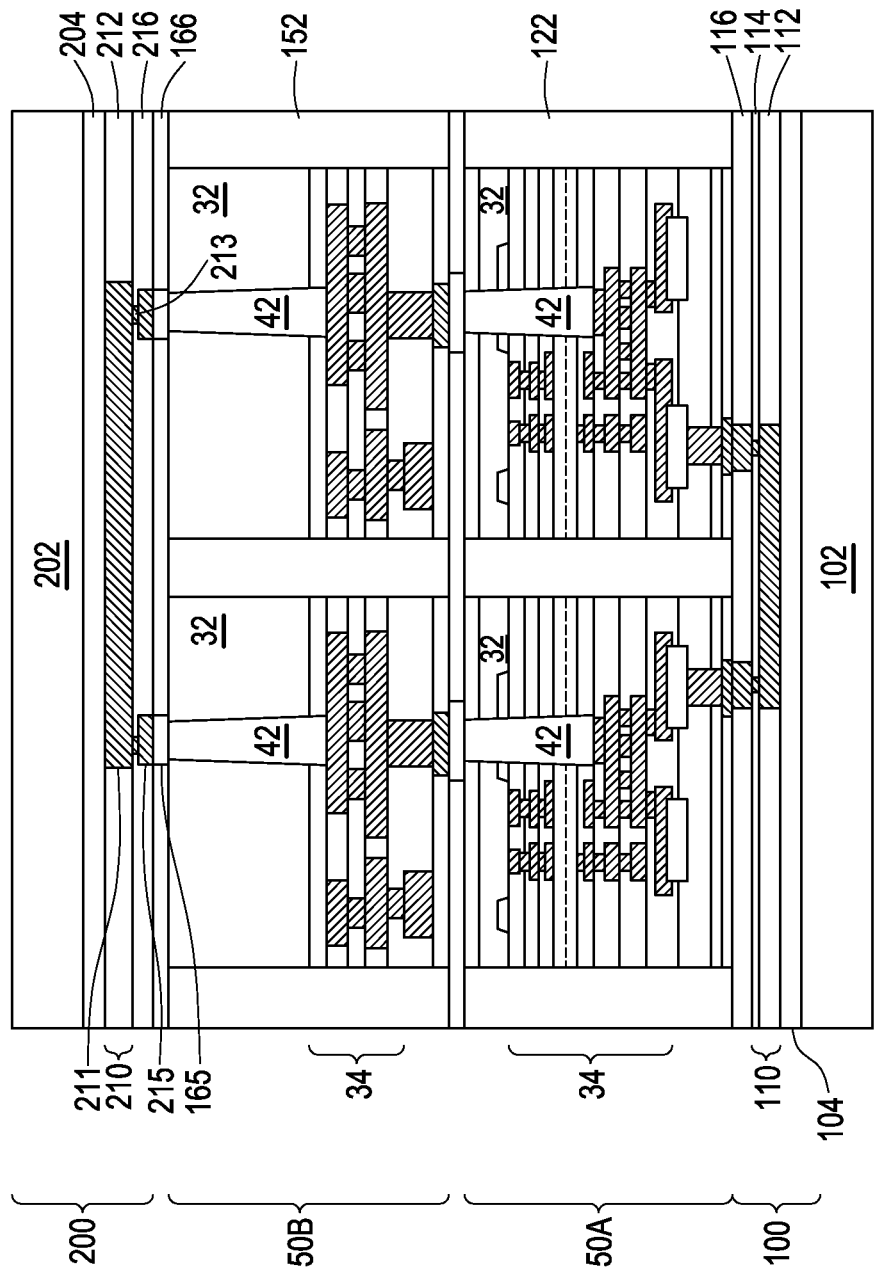

In FIG. 9, a carrier redistribution structure 200 is attached to the top dies 50B with direct bonds. Optionally, before attaching the carrier redistribution structure 200, a dielectric bond layer 166 and bond pads 165 may be formed over the top dies 50B and the encapsulant 152. Similarly, the carrier redistribution structure 200 may include a dielectric bond layer 216 and conductive connectors 215. In some embodiments, the carrier redistribution structure 200 is direct bonded to the top dies 50B similarly as described above in connection with attaching the top dies 50B to the bottom dies 50A and/or attaching the bottom dies 50A to the interposer redistribution structure 100. For example, hybrid bonding, fusion bonding, dielectric bonding, metal bonding, or the like may be used to directly bond the dielectric bond layer 166 and the bond pads 165 of the top dies 50B to the dielectric bond layer 216 and corresponding conductive connectors 215 of the carrier redistribution structure 200 without the use of adhesive or solder. As illustrated, the through vias 42 of the top dies 50B electrically connect the metallization layers of the interconnect structures 34 to the carrier redistribution structure 200.

Before attaching the carrier redistribution structure 200 to the top dies 50B, the carrier redistribution structure 200 may be formed at a wafer level. The carrier redistribution structure 200 may be formed similarly as described above in connection with forming the interposer redistribution structure 100. For example, the carrier redistribution structure 200 may include an interconnect structure 210 formed over a carrier substrate 202. In addition, a dielectric film 204 may be interposed between the carrier substrate 202 and the interconnect structure 210. In some embodiments, an adhesive layer (not specifically illustrated) may be interposed between the carrier substrate 202 and the dielectric film 204. Further, an etch stop layer (not specifically illustrated) may be interposed between the dielectric film 204 and the interconnect structure 210.

In particular, dielectric layers 212, conductive features 211 (e.g., conductive lines), and conductive features 213 (e.g., conductive vias) of the interconnect structure 210 may be formed similarly as described above in connection with the dielectric layers 112 and the conductive features 111, 113 of the interconnect structure 110. The conductive features 211 may include conductive rails providing inter-die communications, such as electrical communications between the top dies 50B. The conductive features 211 may have an entirety of a surface in physical contact with the dielectric film 204 (and/or the etch stop layer, if present). The dielectric bond layer 216 and the conductive connectors 215 may then be formed over the interconnect structure 210 similarly as described above in connection with the dielectric bond layer 116 and the conductive connectors 115 formed over the interconnect structure 110. In some embodiments, the dielectric layers 212 may be an oxide (e.g., silicon oxide), and the dielectric bond layer 216 may be a nitride (e.g., silicon nitride).

In some embodiments (not specifically illustrated), the carrier redistribution structure 200 may be direct bonded to the top dies 50B without forming the dielectric bond layer 166 and the bond pads 165 over the top dies 50B. For example, the semiconductor substrate 32 and the through vias 42 of the top dies 50B may be directly bonded with the dielectric bond layer 216 and the corresponding conductive connectors 215, respectively, of the carrier redistribution structure 200. The process may be performed similarly as described above in connection with attaching the bottom dies 50A to the interposer redistribution structure 100. As such, the through vias 42 and the corresponding conductive connectors 215 may form metal-to-metal bonds, and the semiconductor substrate 32 may be bonded to the dielectric bond layer 216. For example, a thin native oxide may be formed on the semiconductor substrate 32 and be bonded to the dielectric bond layer 216. As a result, a thin silicon nitride and/or silicon oxide layer (such as Si—N—Si and/or Si—O—Si bonds) may be disposed along and interposed between the semiconductor substrate 32 and the dielectric bond layer 216. In some embodiments, the encapsulant 152 may also form dielectric-to-dielectric bonds with the dielectric bond layer 216.

Figure 10:
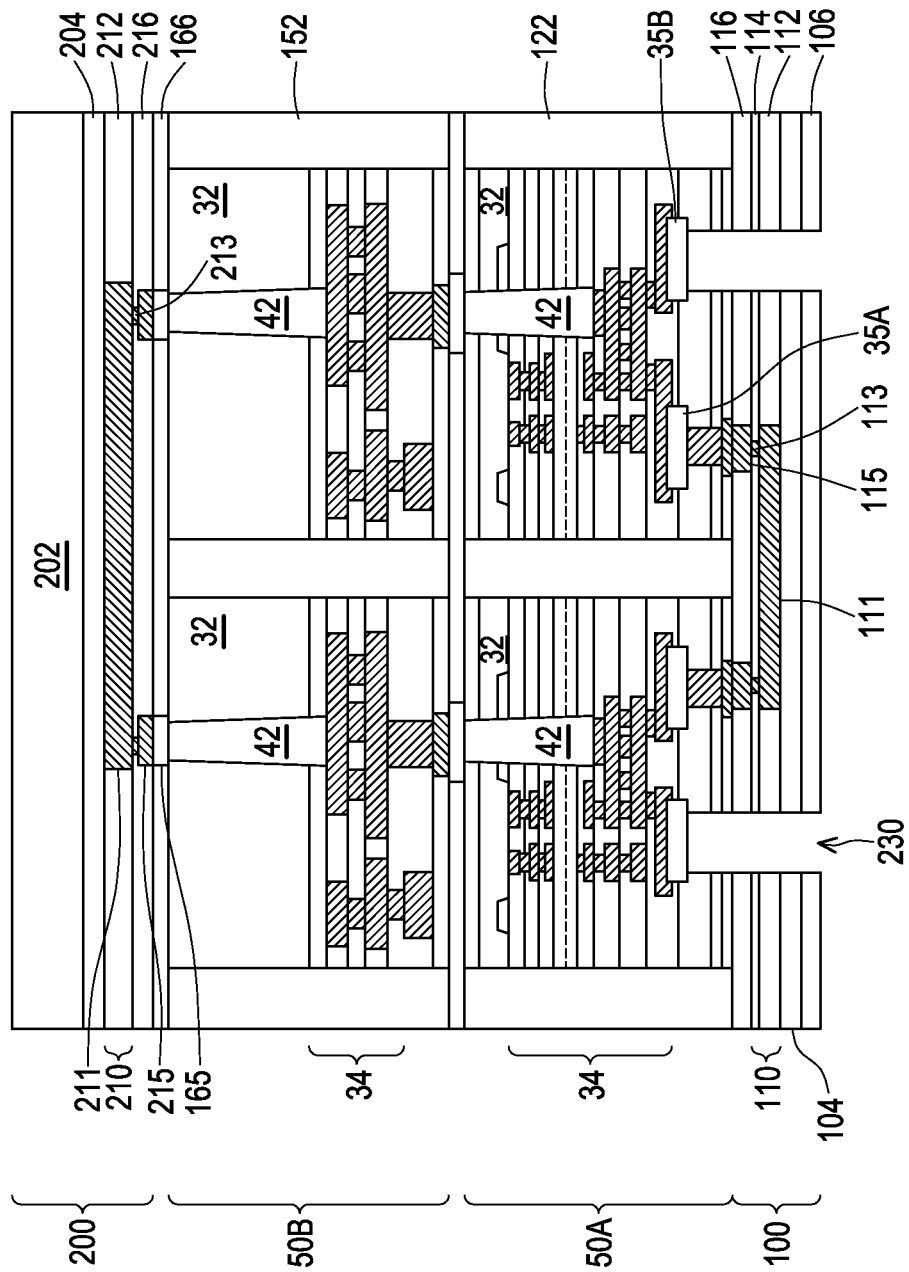

In FIG. 10, the carrier substrate 102 is removed from the interposer redistribution structure 100, and openings 230 are formed through the interposer redistribution structure 100 to expose the metal pads 35B of the bottom dies 50A. In some embodiments with an adhesive layer interposed between the carrier substrate 102 and the dielectric film 104, a debonding process may be performed by projecting a light such as a laser light or an ultraviolet (UV) light on the adhesive layer so that the adhesive layer decomposes under the heat of the light, thereby permitting removal of the carrier substrate 102. It should be noted that the carrier substrate 102 may be removed using any suitable method. If present, the adhesive layer may also be removed, thereby exposing the dielectric film 104.

After removing the carrier substrate 102, a dielectric layer 106 is formed over the dielectric film 104. The dielectric layer 106 is then patterned to form openings 230 exposing portions of the metal pads 35B of the bottom dies 50A. In some embodiments, the patterning may include exposing the dielectric layer 106 to light when the dielectric layer 106 is a photo-sensitive material. In some embodiments, an anisotropic etch may be used to form the openings 230. If the dielectric layer 106 is a photo-sensitive material, the dielectric layer 106 may be developed after the exposure. The etch process may include one or more etch processes through the dielectric layer 106, the dielectric film 104, the etch stop layer (if present), the dielectric layers 112, the dielectric bond layer 116, and the dielectric layers 38 to expose the metal pads 35B of the bottom dies 50A. In some embodiments, the dielectric layer 106 may be a photoresist (not specifically illustrated), which may be used for patterning to form the openings 230. It should be noted that the patterning may be performed using any suitable process.

Figure 11:
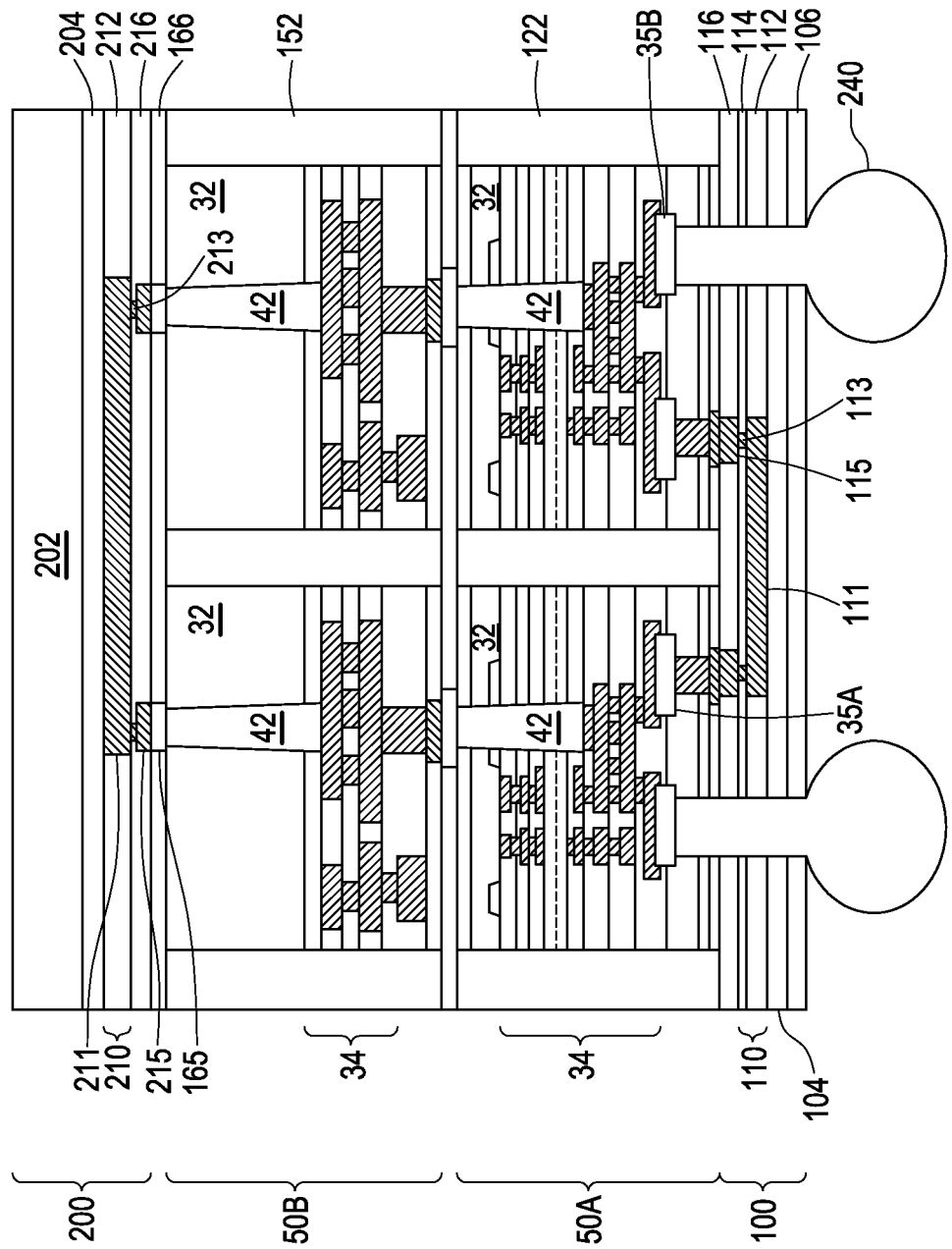

In FIG. 11, external connectors 240 are formed within the openings 230 through the interposer redistribution structure 100 and partially through the bottom dies 50A. The external connectors 240 may extend through the dielectric layers 112 of the interposer redistribution structure 100 without the external connectors 240 having a direct electrical connection with the conductive features 111, 113 of the interconnect structure 110. The external connectors 240 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The external connectors 240 may be formed from a conductive material such as copper, although other conductive materials such as nickel, gold, or metal alloy, combinations of these, or the like may also be used.

In some embodiments (not specifically illustrated), under-bump metallurgy layers (UBMLs) are initially formed in the openings 230 before forming the external connectors 240 over the UBMLs. The UBMLs may have line portions on and extending along the dielectric layer 106 and via portions extending through the openings 230 to physically and electrically couple the UBMLs to the metal pads 35B of the bottom dies 50A. For example, a seed layer is formed over the dielectric layer 106 and in the openings 230. In some embodiments, the seed layer is a metal layer, which may be a single layer or a composite layer comprising a plurality of sub-layers formed of different materials. In some embodiments, the seed layer includes a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMLs. The patterning forms openings through the photoresist to expose the seed layer. A conductive material is then formed in the openings of the photoresist and on the exposed portions of the seed layer. The conductive material may be a metal such as copper, titanium, tungsten, aluminum, or the like, which may be formed by plating, such as electroless plating or electroplating from the seed layer, or the like. The photoresist may be removed by any acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and the conductive material form the UBMLs.

Additionally, the external connectors 240 may be formed using a process such as electroplating, by which an electric current is run through the conductive portions of the metal pads 35B to which the external connectors 240 are desired to be formed. For example, the metal pads 35B may be immersed or submerged in a solution. The solution and the electric current deposit the conductive material (e.g., copper) within the openings 230 in order to fill and/or overfill the openings 230, thereby forming the external connectors 240. Excess conductive material outside of the openings 230 (and the photoresist, if present) may then be removed using, for example, an ashing process, a chemical mechanical polish (CMP) process, an etching process, combinations of these, or the like. In some embodiments (not specifically illustrated), a dielectric liner may be for in the openings 230 before forming the external connectors 240. In addition, an etching process may be performed to remove portions of the dielectric liner in order to expose the metal pads 35B. The external connectors 240 may then be formed in the openings 230 and over the exposed metal pads 35B.

However, as one of ordinary skill in the art will recognize, the above described processes to form the external connectors 240 is merely one such description, and is not meant to limit the embodiments to the above-described process. Rather, the described process is intended to be merely illustrative, as any suitable process for forming the external connectors 240 may be utilized. All suitable processes are fully intended to be included within the scope of the present embodiments.

Although not specifically illustrated, the carrier substrate 202 of the carrier redistribution structure 200 may be thinned and singulated to form individual integrated circuit packages. The singulated integrated circuit package may then undergo further processing, such as being attached to a package substrate (not specifically illustrated) using the external connectors 240.

Figure 12:
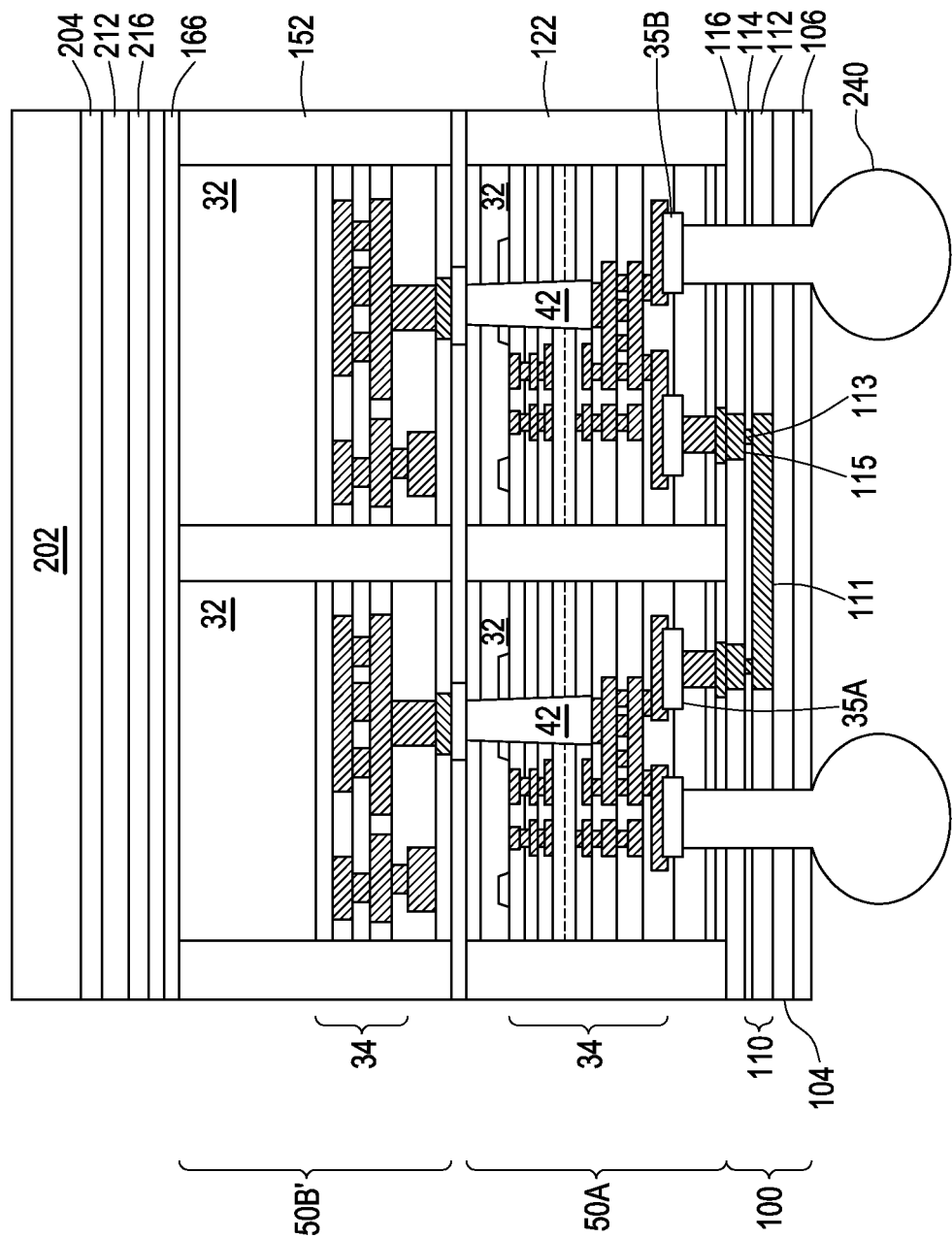
FIG. 12 is a cross-sectional view of an integrated circuit package, in accordance with some embodiments.
Figure 13:
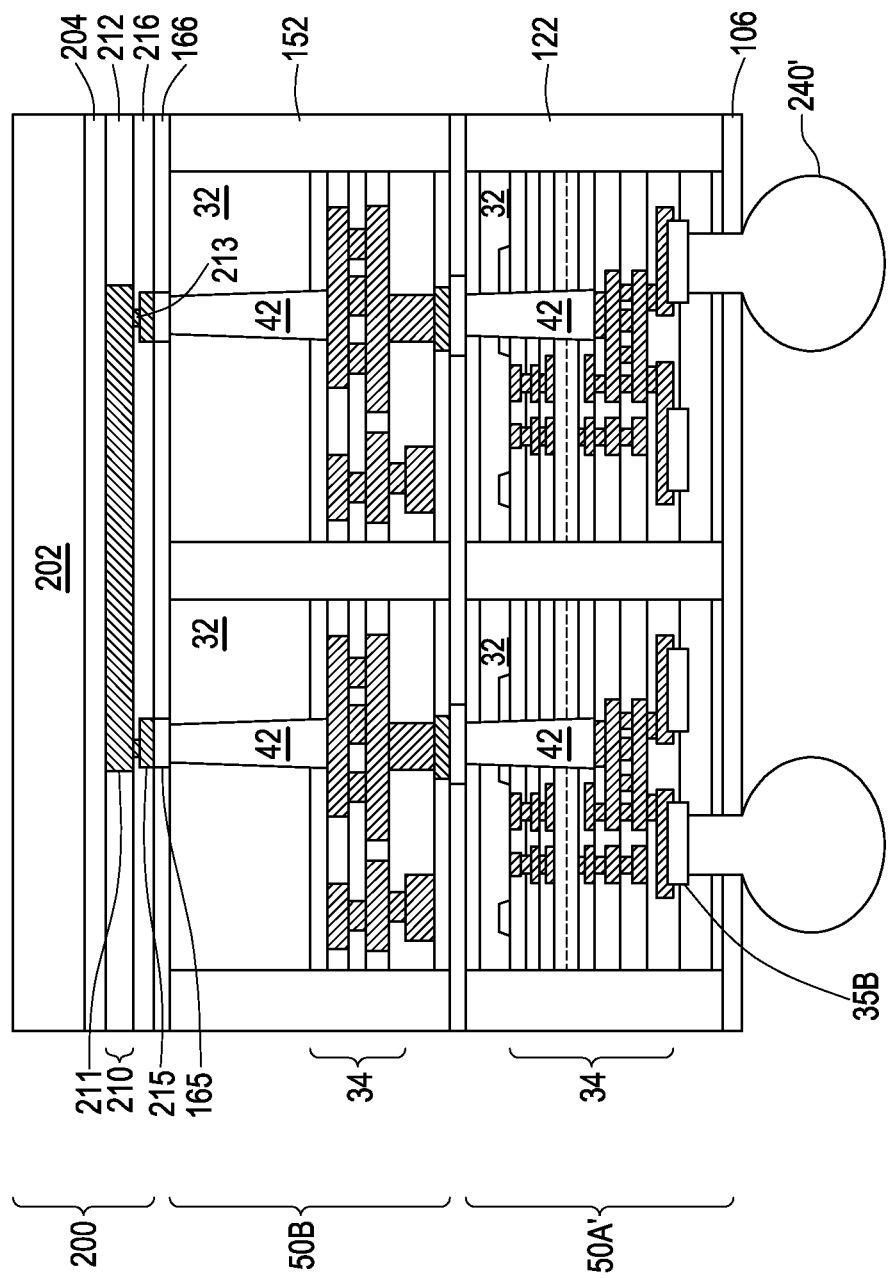
FIG. 13 is a cross-sectional view of an integrated circuit package, in accordance with some embodiments.

FIGS. 12-13 illustrate integrated circuit packages in accordance with some embodiments. These integrated circuit packages may be formed similarly as described above with particular differences discussed below.

In FIG. 12, the illustrated integrated circuit package may be formed with the interposer redistribution structure 100 (similarly as described above) and formed without the carrier redistribution structure 200. As such, top dies 50B' may be formed without the through vias 42 extending through the semiconductor substrate 32 and which would otherwise electrically connect the metallization layers of the interconnect structure 34 to the conductive features 211, 213 of the interconnect structure 210 of the carrier redistribution structure 200. In some embodiments, a structure analogous to the structure of FIG. 8 (e.g., with the top dies 50B' instead of the top dies 50B) may be attached to the carrier substrate 202 shown in FIG. 12.

For example, before attachment of the carrier substrate 202, the dielectric film 204, one or more of the dielectric layers 212, and the dielectric bond layer 216 may be disposed over the carrier substrate 202. In addition, the dielectric bond layer 166 (e.g., comprising one or more layers) may be disposed over the semiconductor substrate 32 of the top dies 50B' and the encapsulant 152 surrounding the top dies 50B'. The dielectric bond layer 166 and the dielectric bond layer 216 along the carrier substrate 202 may be bonded together in order to attach the carrier substrate 202 to the top dies 50B'. In some embodiments, an outermost layer of the dielectric bond layer 166 is an adhesive layer which facilitates the attachment of the carrier substrate 202 to the top dies 50B'. After attachment, the carrier substrate 202 may be thinned and singulated before undergoing further processing, such as being attached to a package substrate (not specifically illustrated) using the external connectors 240. In some embodiments (not specifically illustrated), a single oxide layer (e.g., the dielectric film 204) may be interposed between the carrier substrate 202 and the dielectric bond layer 216, and another single oxide layer (e.g., the dielectric bond layer 166) may be interposed between the top dies 50B and the dielectric bond layer 216.

In FIG. 13, the illustrated integrated circuit package may be formed with the carrier redistribution structure 200 (similarly as described above) and formed without the interposer redistribution structure 100. As such, bottom dies 50A' may be formed without the bond pads 45 and the die connectors 37 extending through the dielectric layers 38 and which would otherwise electrically connect the metal pads 35B to the interposer redistribution structure 100. In some embodiments, the bottom dies 50A' may be attached to the carrier substrate 102 to form a structure analogous to the structure of FIG. 4, albeit without the interposer redistribution structure 100.

For example, although only the dielectric layer 106 is illustrated, before attachment of the interposer redistribution structure 100, the dielectric film 104, the dielectric layers 112, and/or the dielectric bond layer 116 may be disposed over the carrier substrate 102. The dielectric layers 38 and the dielectric bond layer 116 (not specifically illustrated) may be bonded together in order to attach the carrier substrate 102 to the bottom dies 50A'. In some embodiments (not specifically illustrated), an adhesive layer may facilitate the attachment of the carrier substrate 102 to the bottom dies 50A'.

After attachment of the bottom dies 50A' to the carrier substrate 102, the structure may undergo analogous processing steps as described above in connection with FIGS. 5-9, for example, to encapsulate the bottom dies 50A' in the encapsulant 122, to attach the top dies 50B, to encapsulate the top dies 50B in the encapsulant 152, and to attach the carrier redistribution structure 200. In addition, the structure may further undergo analogous processing steps as described above in connection with FIGS. 10-11 to form external connectors 240'. For example, the carrier substrate 102 (as well as the dielectric film 104, the dielectric layers 112, and/or the adhesive, whichever present) may be removed, the dielectric layer 106 may be formed along the bottom dies 50A' and the encapsulant 122, and openings (not specifically illustrated) may be patterned in a similar manner as described above in connection with patterning the openings 230 (see FIG. 10). In addition, the external connectors 240' may be formed in the openings in a similar manner as described above in connection with forming the external connectors 240 in the openings 230 (see FIG. 11). After attaching the carrier redistribution structure 200, the carrier substrate 202 may be thinned and singulated before undergoing further processing, such as being attached to a package substrate (not specifically illustrated) using the external connectors 240.

FIGS. 14-17 illustrate plan view schematics for the above described integrated circuit packages, in accordance with some embodiments. Each figure includes schematics of the interconnect structures 110 of the interposer redistribution structure 100 electrically connecting the bottom dies 50A to one another and schematics of the interconnect structures 210 of the carrier redistribution structure 200 electrically connecting the top dies 50B to one another. The electrical connections are illustrated as straight, but they can include circuitry in all three dimensions. In addition, each electrical connection may extend beyond the footprints and intervening regions of the corresponding integrated circuit devices 50. Note that the illustrated three or four bottom dies 50A and three or four top dies 50B may represent only portions of their respective sets of integrated circuit devices 50 in each integrated circuit package. In addition, each pair of plan view schematics in the figures may illustrate corresponding bottom dies 50A and top dies 50B in a same integrated circuit package, in accordance with some embodiments, or each pair of plan view schematics in the figures may illustrate non-corresponding bottom dies 50A and top dies 50B in a same integrated circuit package, in accordance with various embodiments.

Although two conductive features 111 of the interconnect structure 110 are illustrated for each of the electrical connections between adjacent bottom dies 50A and two conductive features 211 of the interconnect structure 210 are illustrated for each of the electrical connections between adjacent top dies 50B, any number of the conductive features 111 and the conductive features 211 may be utilized. In addition, details of the electrical connections to the bottom dies 50A and to the top dies 50B are omitted in the illustrations to emphasize other features of these embodiments. Further, although not specifically illustrated, some of the conductive components (e.g., the conductive features 111, 113) of the interposer redistribution structure 100 may overlap with some of the bottom dies 50A without being electrically connected to those bottom dies 50A. Similarly, although not specifically illustrated, some of the conductive components (e.g., the conductive features 211, 213) of the carrier redistribution structure 200 may overlap with some of the top dies 50B without being electrically connected to those top dies 50B.

Figure 14:
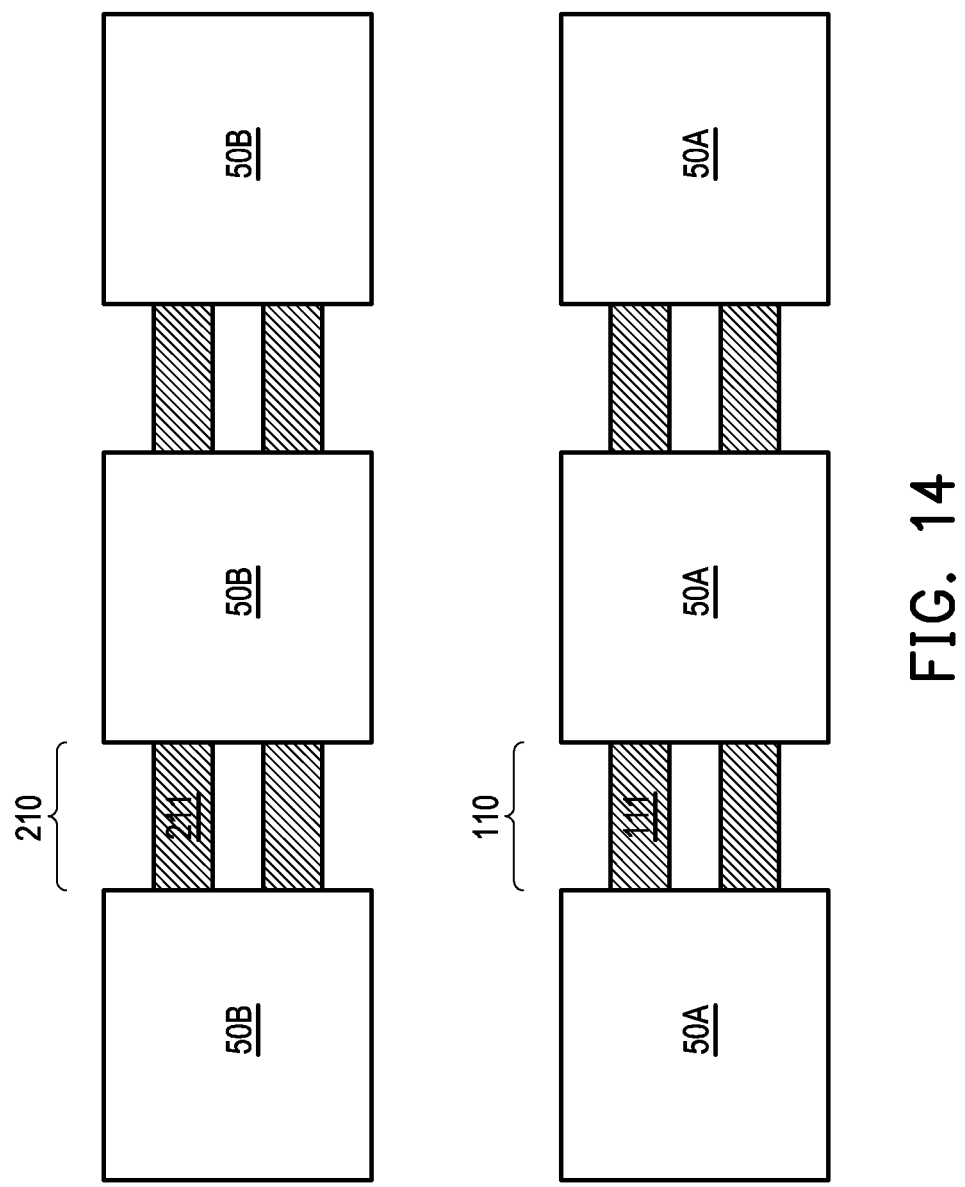
FIGS. 14-17 are plan view schematics of integrated circuit packages, in accordance with some embodiments.

Referring now to FIG. 14, plan view schematics of some or all of the bottom dies 50A and some or all of the top dies 50B are illustrated in linear arrangements, in accordance with some embodiments. For example, adjacent ones of the bottom dies 50A may be electrically connected to one another through the interposer redistribution structure 100, and adjacent ones of the top dies 50B may be electrically connected to one another through the carrier redistribution structure 200.

Figure 15:
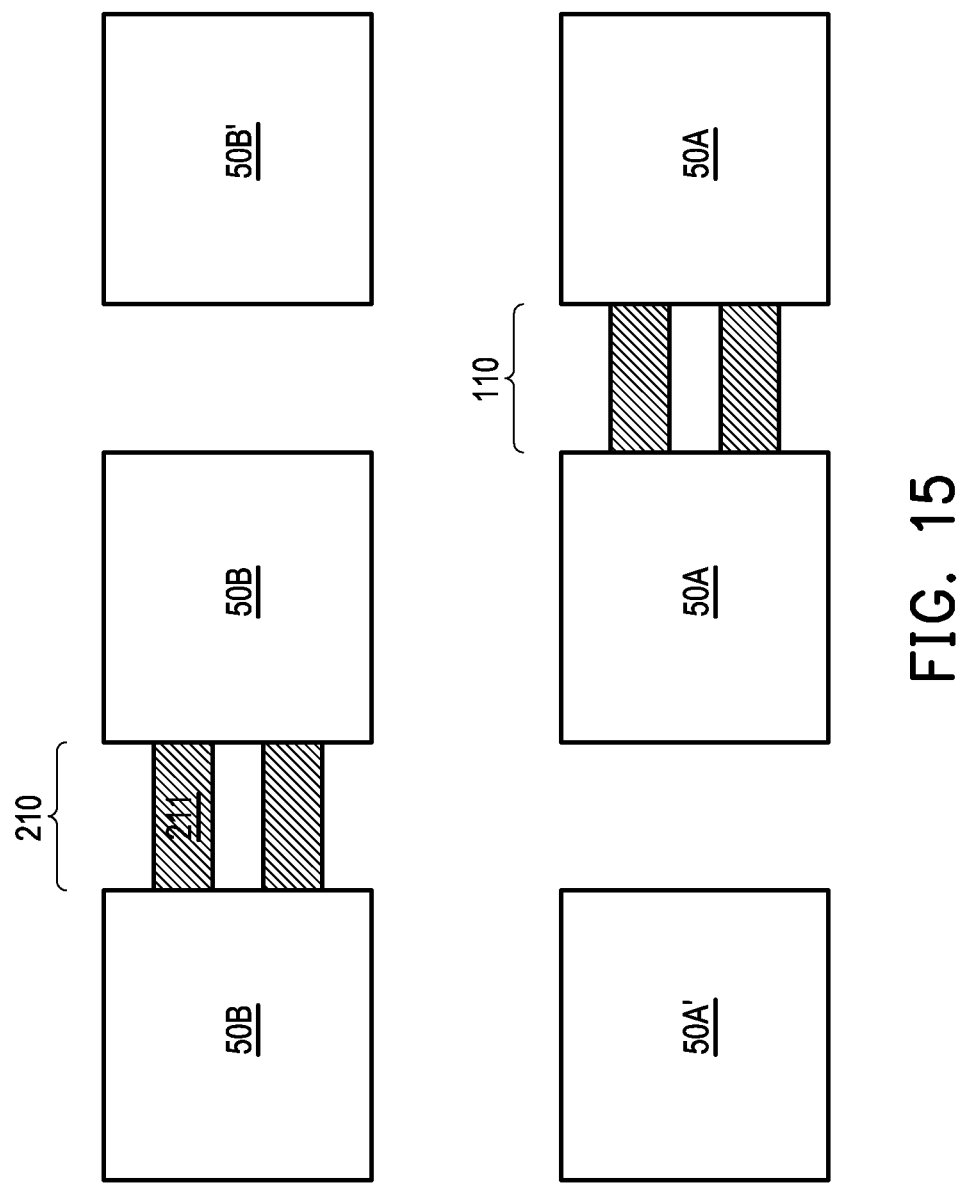

In FIG. 15, plan view schematics of some or all of the bottom dies 50A, 50A' and some or all of the top dies 50B, 50B' are illustrated in linear arrangements, in accordance with some embodiments. For example, only some pairs of bottom dies 50A may be electrically connected to one another through the interposer redistribution structure 100, while some pairs of bottom dies 50A may not be electrically connected to one another through the interposer redistribution structure 100. In particular, the bottom dies 50A may have "direct" die-to-die electrical connections through the interposer redistribution structure 100, while the bottom dies 50A' may lack direct die-to-die electrical connection with other bottom dies 50A, 50A'. It should be noted that a direct die-to-die electrical connection is an electrical connection that does not include any intervening integrated circuit devices 50. However, some or all of the bottom dies 50A' may be indirectly connected to the other bottom dies 50A, 50A', for example, through the top dies 50B and the carrier redistribution structure 200. While the bottom die 50A' is illustrated as not having a direct die-to-die electrical connection to other bottom dies 50A, 50A', the bottom die 50A' may have a direct die-to-die electrical connection to an overlying top die, such as one or more of the top dies 50B, 50B'.

Similarly, only some pairs of top dies 50B may be electrically connected to one another through the carrier redistribution structure 200, while some pairs of top dies 50B may not be electrically connected to one another through the carrier redistribution structure 200. In particular, the top dies 50B may have direct die-to-die electrical connections through the carrier redistribution structure 200, while the top dies 50B' may lack direct die-to-die electrical connection with other top dies 50B, 50B'. Similarly as discussed above, a direct die-to-die electrical connection is an electrical connection that does not include any intervening integrated circuit devices 50. However, some or all of the top dies 50B' may be indirectly connected to the other top dies 50B, 50B', for example, through the bottom dies 50A and the interposer redistribution structure 100. While the top die 50B' is illustrated as not having a direct die-to-die electrical connection to other top dies 50B, 50B', the top die 50B' may have a direct die-to-die electrical connection to an underlying bottom die, such as one or more of the bottom dies 50A, 50A'.

Figure 16:
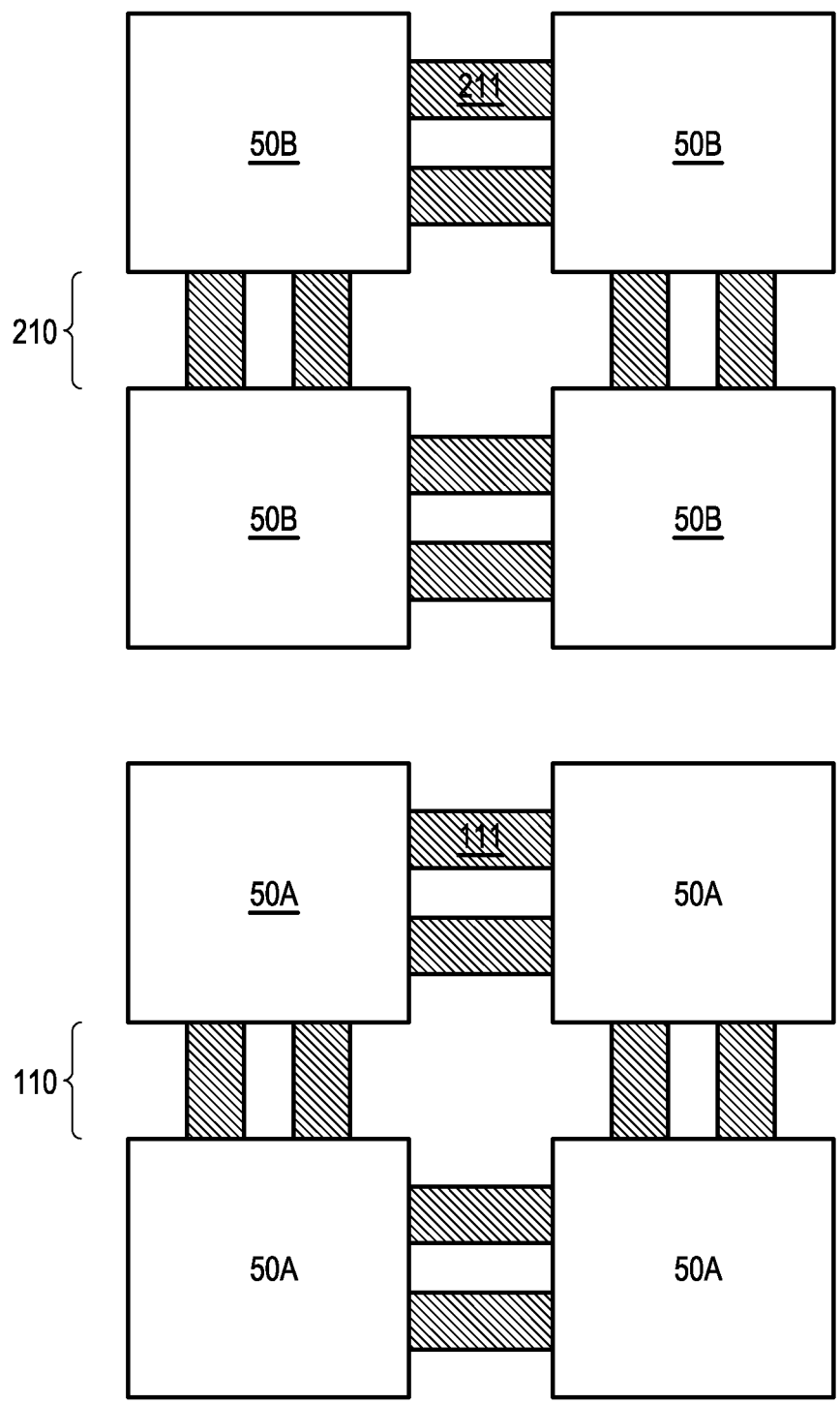

In FIG. 16, plan view schematics of some or all of the bottom dies 50A and some or all of the top dies 50B are illustrated in rectangular arrangements, in accordance with some embodiments. For example, adjacent ones of the bottom dies 50A may be electrically connected to one another through the interposer redistribution structure 100, and adjacent ones of the top dies 50B may be electrically connected to one another through the carrier redistribution structure 200.

Figure 17:
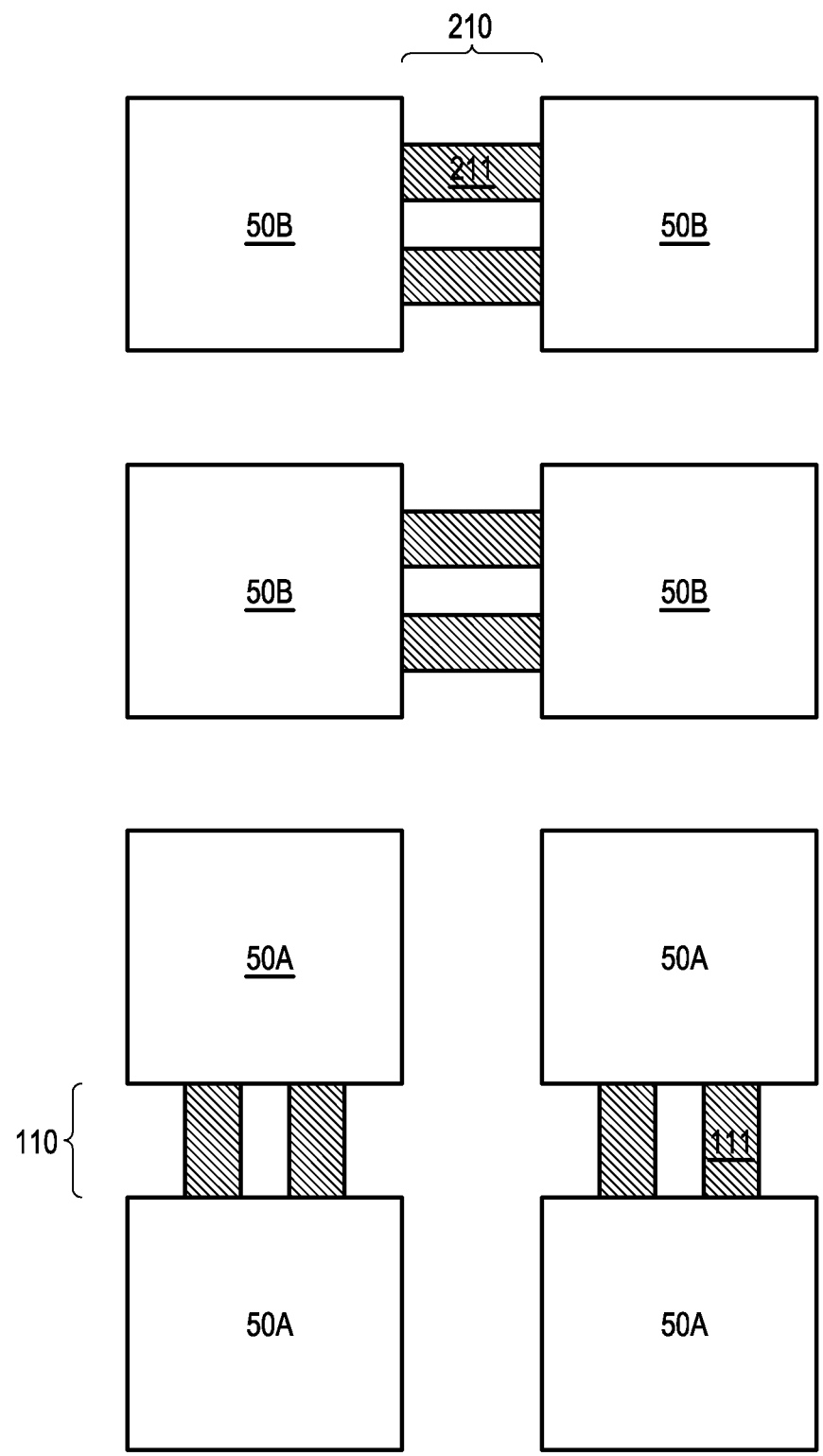

In FIG. 17, plan view schematics of some or all of the bottom dies 50A and some or all of the top dies 50B are illustrated in rectangular arrangements, in accordance with some embodiments. For example, only some pairs of the bottom dies 50A may be electrically connected to one another through the interposer redistribution structure 100, while some pairs of the bottom dies 50A may not be electrically connected to one another through the interposer redistribution structure 100. In particular, the bottom dies 50A may have some direct die-to-die electrical connections with other bottom dies 50A through the interposer redistribution structure 100, while lacking direct die-to-die electrical connection with some other bottom dies 50A. However, some or all of the bottom dies 50A may be indirectly connected to the some other bottom dies 50A, for example, through the top dies 50B and the carrier redistribution structure 200.

Similarly, only some pairs of the top dies 50B may be electrically connected to one another through the carrier redistribution structure 200, while some pairs of the top dies 50B may not be electrically connected to one another through the carrier redistribution structure 200. In particular, the top dies 50B may have some direct die-to-die electrical connections with other top dies 50B through the carrier redistribution structure 200, while lacking direct die-to-die electrical connection with other top dies 50B. However, some or all of the top dies 50B may be indirectly connected to the some other top dies 50B, for example, through the bottom dies 50A and the interposer redistribution structure 100.

Figure 18:
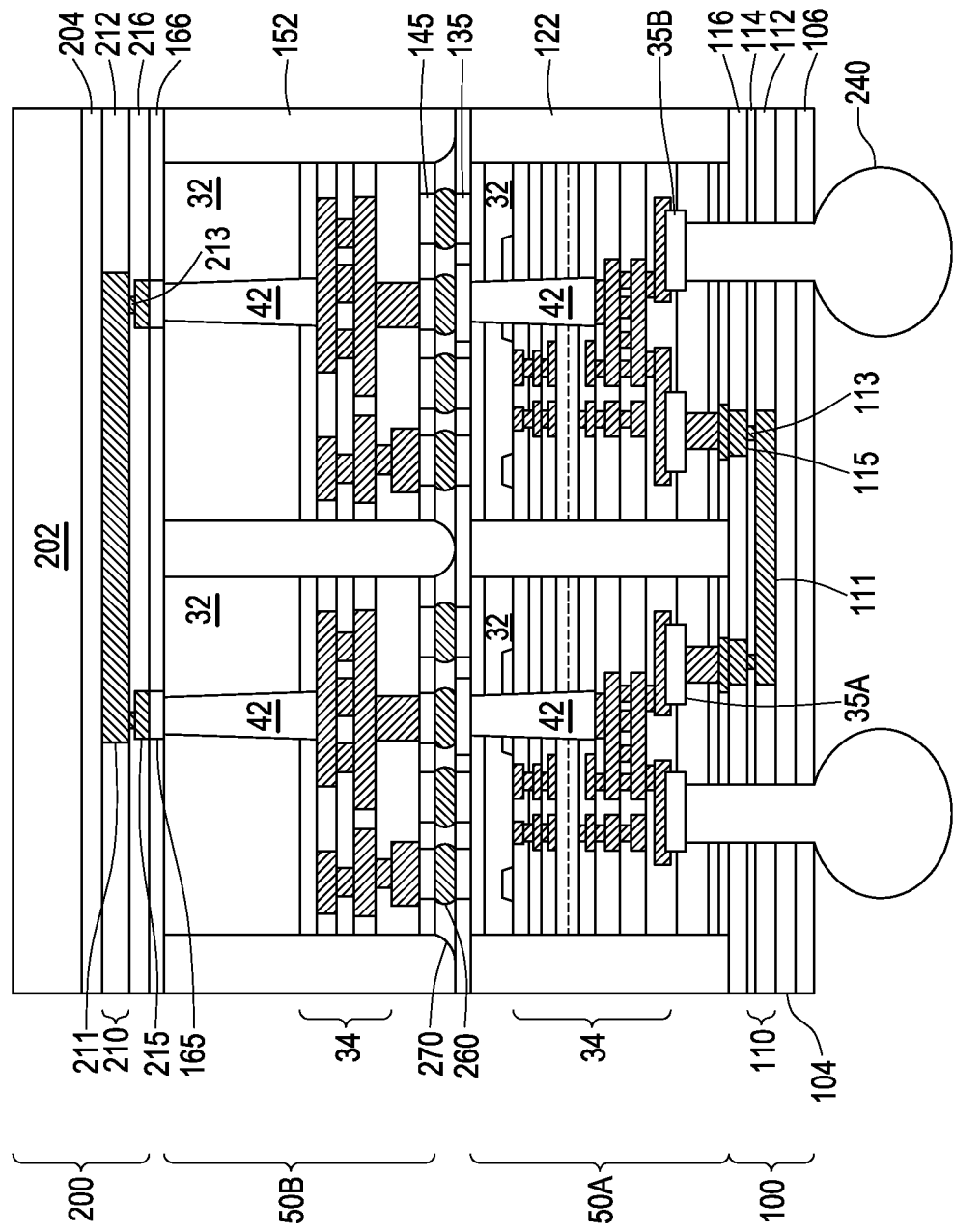
FIG. 18 is a cross-sectional view of an integrated circuit package, in accordance with some embodiments.

In FIG. 18, in accordance with embodiments discussed above in connection with FIG. 11 (although applicable to any embodiments described above), the top dies may be attached to the bottom dies 50A using bonding techniques other than direct bonding. In particular, the top dies 50B may be attached using electrical connectors 260 (e.g., solder balls) and forming an underfill 270 around the electrical connectors 260 and between the top dies 50B and the bottom dies 50A. For example, the electrical connectors 260, such as microbumps, ball grid array (BGA) connectors, solder balls, metal pillars, controlled collapse chip connection (C4) bumps, electroless nickel-electroless palladium-immersion gold technique (ENEPIG) formed bumps, or the like may be used to electrically couple the bond pads 135 adjacent the bottom dies 50A to the bond pads 145 of the top dies 50B. In some embodiments, the top dies 50B may be placed on the bottom dies 50A using, e.g., a pick-and-place tool. The electrical connectors 260 may be formed of a conductive material that is flowable, such as solder, copper, aluminum, gold, nickel, silver, palladium, tin, the like, or a combination thereof, may be formed by initially forming a layer of solder through methods such as evaporation, electroplating, printing, solder transfer, ball placement, or the like. In some embodiments, a layer of solder may be deposited over the bond pads 135 or the bond pads 145, the solder may be reflowed to shape the electrical connectors 260 into a desired shape, the top dies 50B may be placed onto the bottom dies 50A, and the electrical connectors 260 may be reflowed to attach the top dies 50B to the bottom dies 50A.

In addition, the underfill 270 may then be formed around the electrical connectors 260 and between the top dies 50B and the bottom dies 50A. The underfill 270 may reduce stress and protect the joints resulting from the reflowing of the conductive material. The underfill 270 may be formed of an underfill material such as a molding compound, epoxy, or the like. The underfill 270 may be formed by a capillary flow process after the top dies 50B are attached to the bottom dies 50A, or may be formed by a suitable deposition method before the top dies 50B are attached to the bottom dies 50A. The underfill 270 may be applied in liquid or semi-liquid form and then subsequently cured. In some embodiments (not specifically illustrated), portions of the underfill 270 may partially or completely fill the spaces between adjacent pairs of the top dies 50B. For example, the underfill 270 may be injected into those spaces or spread into those spaces, for example, in a capillary flow.

Further, the encapsulant 152 may then be formed over and around the underfill 270, similarly as described above (see, e.g., FIG. 8). For example, the encapsulant 152 may be a molding compound, an epoxy, a resin, or the like. The encapsulant 152 may be applied by compression molding, transfer molding, or the like, and may be formed over the structure such that the top dies 50B are buried or covered. As additional examples, the encapsulant 152 may comprise a nitride (e.g., silicon nitride) and/or an oxide (e.g., silicon oxide) and may be deposited using spin coating, FCVD, PECVD, LPCVD, ALD, or any suitable process. The encapsulant 152 may be applied in liquid or semi-liquid form and then subsequently cured. The encapsulant 152 is optionally thinned to expose the top dies 50B, and the structure then undergoes similar processing steps as described above in connection with FIGS. 8-11.

In accordance with some embodiments (not specifically illustrated), any combinations of the above-described interposer redistribution structures 100 may be utilized to electrically connect adjacent or non-adjacent bottom dies 50A to one another. Similarly, any combinations of the above-described carrier redistribution structures 200 may be utilized to electrically connect adjacent or non-adjacent top dies 50B to one another.

Embodiments may achieve advantages. Including either or both of the above-described redistribution structures (e.g., the interposer redistribution structure 100 and the carrier redistribution structure 200) increases the options for electrical connectivity between dies throughout the integrated circuit package. The redistribution structures may be formed at the wafer level in similar manners over their respective carrier substrates 102, 202. In addition, external connectors may be formed through the interposer redistribution structure 100 to provide direct power and signal connection to the bottom dies 50A. As a result, the interconnect structure 110 of the interposer redistribution structure 100 may provide electrical connection between the bottom dies 50A, thereby preventing or reducing heat dissipation issues within and around the conductive features 111, 113 of the interconnect structure 110.

In an embodiment, a method includes: attaching a first die and a second die to a first wafer, the first wafer comprising: a first carrier substrate; and a first interconnect structure comprising first dielectric layers and first conductive features embedded in the first dielectric layers; encapsulating the first die and the second die in a first encapsulant; attaching a third die to the first die and a fourth die to the second die, the third die being electrically connected to the first die, the fourth die being electrically connected to the second die; encapsulating the third die and the fourth die in a second encapsulant; attaching a second wafer to the third die and the fourth die, the second wafer comprising: a second carrier substrate; and a second interconnect structure comprising second dielectric layers and second conductive features embedded in the second dielectric layers; removing the first carrier substrate; patterning the first dielectric layers to expose conductive features of the first die and the second die; and forming external connectors through the first dielectric layers, the external connectors being electrically connected to corresponding ones of the conductive features of the first die and the second die. In another embodiment, the first interconnect structure electrically connects the first die to the second die. In another embodiment, the second interconnect structure electrically connects the third die to the fourth die. In another embodiment, the first die is electrically interposed between a first external connector of the external connectors and the first conductive features of the first interconnect structure, and wherein the second die is electrically interposed between a second external connector of the external connectors and the first conductive features of the first interconnect structure. In another embodiment, attaching the third die and the fourth die to the first die and the second die comprises: performing a removal process to expose a first conductive via of the first die and a second conductive via of the second die; depositing a first dielectric bond layer over the first die, the second die, and the first encapsulant; forming a first bond pad and a second bond pad in the first dielectric bond layer, the first bond pad being electrically connected to the first conductive via, the second bond pad being electrically connected to the second conductive via; direct bonding a third dielectric bond layer and a third bond pad of the third die to the first dielectric bond layer and the first bond pad, respectively; and direct bonding a fourth dielectric bond layer and a fourth bond pad of the fourth die to the first dielectric bond layer and the second bond pad, respectively. In another embodiment, the method further includes: attaching a fifth die to the first wafer; attaching a sixth die to the fifth die, the sixth die being electrically connected to the fifth die; and attaching the second interconnect structure to the sixth die, wherein the first interconnect structure electrically connects the second die to the fifth die, and wherein the second interconnect structure electrically connects the third die to the fourth die. In another embodiment, the first die lacks direct electrical connection to the first interconnect structure, and wherein the sixth die lacks direct electrical connection to the second interconnect structure.

In an embodiment, a semiconductor device includes: a first bottom die and a second bottom die disposed over a first redistribution structure, the first redistribution structure comprising: first dielectric layers; and first conductive features, the first conductive features electrically connecting the first bottom die to the second bottom die; a first top die disposed over and electrically connected to a first through via of the first bottom die; a second top die disposed over and electrically connected to a second through via of the second bottom die; and a first external connector and a second external connector extending through an entirety of the first dielectric layers, the first external connector being in contact with a first metal pad of the first bottom die, the second external connector being in contact with a second metal pad of the second bottom die. In another embodiment, the first conductive features electrically connect a third metal pad of the first bottom die to a fourth metal pad of the second bottom die. In another embodiment, the first conductive features comprise a first conductive rail, wherein the first conductive rail comprises a lowermost surface facing opposite the first bottom die and the second bottom die, and wherein an entirety of the lowermost surface physically contacts a first dielectric film. In another embodiment, the semiconductor device further includes a second redistribution structure disposed over the first top die and the second top die, the second redistribution structure comprising: second dielectric layers; and second conductive features, the second conductive features electrically connecting the first top die to the second top die. In another embodiment, the second conductive features electrically connect a third through via of the first top die to a fourth through via of the second top die. In another embodiment, the second conductive features comprise a second conductive rail, wherein the second conductive rail comprises an uppermost surface facing opposite the first top die and the second top die, and wherein an entirety of the uppermost surface physically contacts a second dielectric film. In another embodiment, the semiconductor device further includes: a first dielectric bond layer over the first bottom die; a first bond pad disposed in the first dielectric bond layer; a second dielectric bond layer along the second bottom die; a second bond pad disposed in the second dielectric bond layer; a third dielectric bond layer over the first redistribution structure; and a first conductive connector and a second conductive connector disposed in the third dielectric bond layer, wherein the first bond pad physically contacts the first conductive connector, wherein the second bond pad physically contacts the second conductive connector, and wherein the first dielectric bond layer and the second dielectric bond layer physically contact the third dielectric bond layer.

In an embodiment, a semiconductor device includes: bottom dies being laterally displaced from one another; top dies being disposed over the bottom dies, the top dies being laterally displaced from one another; a first redistribution structure being disposed adjacent the bottom dies, a first pair of the bottom dies having direct die-to-die electrical connection through the first redistribution structure, a second pair of the bottom dies lacking direct die-to-die electrical connection through the first redistribution structure; and a second redistribution structure being disposed over the top dies, a first pair of the top dies having direct die-to-die electrical connection through the second redistribution structure, a second pair of the top dies lacking direct die-to-die electrical connection through the second redistribution structure. In another embodiment, a first die of the bottom dies and a first die of the top dies are electrically interposed between the first redistribution structure and the second redistribution structure. In another embodiment, the second pair of the bottom dies are electrically connected to each other through the first pair of top dies. In another embodiment, the second pair of the top dies are electrically connected to each other through the first pair of the bottom dies. In another embodiment, the semiconductor device further includes an external connector extending through the first redistribution structure, the external connector being electrically connected to at least one of the bottom dies. In another embodiment, the external connector lacks direct electrical connection to the first redistribution structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    attaching a first die and a second die to a first wafer, the first wafer comprising:
        a first carrier substrate; and
        a first interconnect structure comprising first dielectric layers and first conductive features embedded in the first dielectric layers;
    encapsulating the first die and the second die in a first encapsulant;
    attaching a third die to the first die and a fourth die to the second die, the third die being electrically connected to the first die, the fourth die being electrically connected to the second die;
    encapsulating the third die and the fourth die in a second encapsulant;
    attaching a second wafer to the third die and the fourth die, the second wafer comprising:
        a second carrier substrate; and
        a second interconnect structure comprising second dielectric layers and second conductive features embedded in the second dielectric layers;
    removing the first carrier substrate;
    patterning the first dielectric layers to expose conductive features of the first die and the second die; and
    forming external connectors through the first dielectric layers, the external connectors being electrically connected to corresponding ones of the conductive features of the first die and the second die.

2. The method of claim 1, wherein the first interconnect structure electrically connects the first die to the second die.

3. The method of claim 2, wherein the second interconnect structure electrically connects the third die to the fourth die.

4. The method of claim 1, wherein the first die is electrically interposed between a first external connector of the external connectors and the first conductive features of the first interconnect structure, and wherein the second die is electrically interposed between a second external connector of the external connectors and the first conductive features of the first interconnect structure.

5. The method of claim 1, wherein attaching the third die and the fourth die to the first die and the second die comprises:
    performing a removal process to expose a first conductive via of the first die and a second conductive via of the second die;
    depositing a first dielectric bond layer over the first die, the second die, and the first encapsulant;
    forming a first bond pad and a second bond pad in the first dielectric bond layer, the first bond pad being electrically connected to the first conductive via, the second bond pad being electrically connected to the second conductive via;
    direct bonding a third dielectric bond layer and a third bond pad of the third die to the first dielectric bond layer and the first bond pad, respectively; and
    direct bonding a fourth dielectric bond layer and a fourth bond pad of the fourth die to the first dielectric bond layer and the second bond pad, respectively.

6. The method of claim 1, further comprising:
    attaching a fifth die to the first wafer;
    attaching a sixth die to the fifth die, the sixth die being electrically connected to the fifth die; and attaching the second interconnect structure to the sixth die, wherein the first interconnect structure electrically connects the second die to the fifth die, and wherein the second interconnect structure electrically connects the third die to the fourth die.

7. The method of claim 6, wherein the first die lacks direct electrical connection to the first interconnect structure, and wherein the sixth die lacks direct electrical connection to the second interconnect structure.

8. A semiconductor device comprising:
a first bottom die and a second bottom die disposed over a first redistribution structure, the first redistribution structure comprising:
first dielectric layers; and
first conductive features, the first conductive features electrically connecting the first bottom die to the second bottom die;
a first top die disposed over and electrically connected to a first through via of the first bottom die;
a second top die disposed over and electrically connected to a second through via of the second bottom die; and
a first external connector and a second external connector extending through an entirety of the first dielectric layers, the first external connector being in contact with a first metal pad of the first bottom die, the second external connector being in contact with a second metal pad of the second bottom die.

9. The semiconductor device of claim 8, wherein the first conductive features electrically connect a third metal pad of the first bottom die to a fourth metal pad of the second bottom die.

10. The semiconductor device of claim 9, wherein the first conductive features comprise a first conductive rail, wherein the first conductive rail comprises a lowermost surface facing opposite the first bottom die and the second bottom die, and wherein an entirety of the lowermost surface physically contacts a first dielectric film.

11. The semiconductor device of claim 8, further comprising a second redistribution structure disposed over the first top die and the second top die, the second redistribution structure comprising:
second dielectric layers; and
second conductive features, the second conductive features electrically connecting the first top die to the second top die.

12. The semiconductor device of claim 11, wherein the second conductive features electrically connect a third through via of the first top die to a fourth through via of the second top die.

13. The semiconductor device of claim 12, wherein the second conductive features comprise a second conductive rail, wherein the second conductive rail comprises an uppermost surface facing opposite the first top die and the second top die, and wherein an entirety of the uppermost surface physically contacts a second dielectric film.

14. The semiconductor device of claim 8, further comprising:
a first dielectric bond layer over the first bottom die;
a first bond pad disposed in the first dielectric bond layer;
a second dielectric bond layer along the second bottom die;
a second bond pad disposed in the second dielectric bond layer;
a third dielectric bond layer over the first redistribution structure; and
a first conductive connector and a second conductive connector disposed in the third dielectric bond layer, wherein the first bond pad physically contacts the first conductive connector, wherein the second bond pad physically contacts the second conductive connector, and wherein the first dielectric bond layer and the second dielectric bond layer physically contact the third dielectric bond layer.

15. A semiconductor device, comprising:
bottom dies being laterally displaced from one another;
top dies being disposed over the bottom dies, the top dies being laterally displaced from one another;
a first redistribution structure being disposed adjacent the bottom dies, a first pair of the bottom dies having direct die-to-die electrical connection through the first redistribution structure, a second pair of the bottom dies lacking direct die-to-die electrical connection through the first redistribution structure; and
a second redistribution structure being disposed over the top dies, a first pair of the top dies having direct die-to-die electrical connection through the second redistribution structure, a second pair of the top dies lacking direct die-to-die electrical connection through the second redistribution structure.

16. The semiconductor device of claim 15, wherein a first die of the bottom dies and a first die of the top dies are electrically interposed between the first redistribution structure and the second redistribution structure.

17. The semiconductor device of claim 16, wherein the second pair of the bottom dies are electrically connected to each other through the first pair of the top dies.

18. The semiconductor device of claim 17, wherein the second pair of the top dies are electrically connected to each other through the first pair of the bottom dies.

19. The semiconductor device of claim 15, further comprising an external connector extending through the first redistribution structure, the external connector being electrically connected to at least one of the bottom dies.

20. The semiconductor device of claim 19, wherein the external connector lacks direct electrical connection to the first redistribution structure.

\* \* \* \* \*